United States Patent
Park et al.

(10) Patent No.: US 11,695,034 B2
(45) Date of Patent: *Jul. 4, 2023

(54) CAPACITOR STRUCTURE, METHOD OF FORMING THE SAME, SEMICONDUCTOR DEVICE INCLUDING THE CAPACITOR STRUCTURE AND METHOD OF MANUFACTURING THE SAME

(71) Applicant: Samsung Electronics Co., Ltd., Suwon-si (KR)

(72) Inventors: Seongyul Park, Seoul (KR); Jaewan Chang, Seoul (KR); Suhwan Kim, Seoul (KR); Hyunjun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/731,032

(22) Filed: Apr. 27, 2022

(65) Prior Publication Data
US 2022/0254873 A1    Aug. 11, 2022

Related U.S. Application Data

(63) Continuation of application No. 17/030,152, filed on Sep. 23, 2020, now Pat. No. 11,348,995.

(30) Foreign Application Priority Data

Dec. 30, 2019    (KR) .......................... 10-2019-0177914

(51) Int. Cl.
*H01L 21/469*    (2006.01)
*H01L 21/02*    (2006.01)
(Continued)

(52) U.S. Cl.
CPC ........ *H01L 28/91* (2013.01); *H01L 27/10814* (2013.01); *H01L 27/10855* (2013.01); *H01L 28/92* (2013.01)

(58) Field of Classification Search
CPC .................................................. H01L 27/10855
(Continued)

(56) References Cited

U.S. PATENT DOCUMENTS 6,660,660 B2    12/2003    Haukka et al.
7,109,548 B2    9/2006    Forbes et al.
(Continued)

FOREIGN PATENT DOCUMENTS

JP            5262233 B2     8/2013
KR      100655140 B1    12/2006
(Continued)

*Primary Examiner* — Calvin Lee
(74) *Attorney, Agent, or Firm* — Muir Patent Law, PLLC

(57) ABSTRACT

A capacitor structure may include a lower electrode on a substrate, a dielectric layer on the substrate, and an upper electrode on the dielectric layer. The lower electrode may include a metal nitride having a chemical formula of $M^1N_y$ ($M^1$ is a first metal, and y is a positive real number). The dielectric layer may include a metal oxide and nitrogen (N), the metal oxide having a chemical formula of $M^2O_x$ ($M^2$ is a second metal, and x is a positive real number). A maximum value of a detection amount of nitrogen (N) in the dielectric layer may be greater than a maximum value of a detection amount of nitrogen (N) in the lower electrode.

20 Claims, 26 Drawing Sheets

(51) Int. Cl.
*H01L 49/02* (2006.01)
*H01L 27/108* (2006.01)

(58) Field of Classification Search
USPC ......... 257/332, 405, 412, 760–765; 438/523,
438/533, 686, 785
See application file for complete search history.

(56) References Cited

U.S. PATENT DOCUMENTS

| | | | |
|---|---|---|---|
| 7,242,265 B2 * | 7/2007 | Masuda | H01P 1/203 |
| | | | 333/156 |
| 7,323,737 B2 | 1/2008 | Basceri et al. | |
| 7,704,867 B2 | 4/2010 | Kim et al. | |
| 8,796,087 B2 | 8/2014 | Kim et al. | |
| 8,809,160 B2 | 8/2014 | Chen et al. | |
| 8,940,611 B2 | 1/2015 | Kim et al. | |
| 9,105,646 B2 | 8/2015 | Malhotra et al. | |
| 9,818,847 B2 * | 11/2017 | Dewey | H01L 29/42392 |
| 9,923,047 B2 | 3/2018 | Oh et al. | |
| 10,636,795 B2 * | 4/2020 | Ahn | H01L 27/10888 |
| 10,847,603 B2 | 11/2020 | Moon et al. | |
| 11,348,995 B2 * | 5/2022 | Park | H01L 27/10852 |
| | | | 257/405 |

FOREIGN PATENT DOCUMENTS

| | | |
|---|---|---|
| KR | 100668827 B1 | 1/2007 |
| KR | 20160084895 A | 7/2016 |

\* cited by examiner

US 11,695,034 B2

CAPACITOR STRUCTURE, METHOD OF FORMING THE SAME, SEMICONDUCTOR DEVICE INCLUDING THE CAPACITOR STRUCTURE AND METHOD OF MANUFACTURING THE SAME

CROSS-REFERENCE TO RELATED APPLICATION

This application is a continuation of U.S. application Ser. No. 17/030,152, now U.S. Pat. No. 11,348,995 issued May 31, 2022, which claims priority under 35 U.S. C. § 119 to Korean Patent Application No. 10-2019-0177914 filed on Dec. 30, 2019 in the Korean Intellectual Property Office, the disclosure of each of these applications being hereby incorporated by reference in its entirety.

TECHNICAL FIELD

Example embodiments of the present disclosure relate to a semiconductor device and a method of manufacturing the same, and more specifically, a semiconductor device including a capacitor structure and a method of manufacturing the same.

DISCUSSION OF RELATED ART

In a manufacturing method of a semiconductor device, a capacitor structure may be formed to include a lower electrode, a dielectric layer, and an upper electrode sequentially stacked on a substrate, and may be electrically connected to a contact plug. In order to improve the electrical characteristics of the capacitor structure, a permittivity of the dielectric layer may be improved by increasing the thickness of the dielectric layer, however, the integration degree of the semiconductor device may be deteriorated.

SUMMARY

Example embodiments provide a capacitor structure having improved electrical characteristics.

Example embodiments provide a method of forming the capacitor structure having improved electrical characteristics.

Example embodiments provide a semiconductor device including the capacitor structure having improved electrical characteristics.

Example embodiments provide a method of manufacturing the semiconductor device including the capacitor structure having improved electrical characteristics.

According to example embodiments of the inventive concepts, a capacitor structure may include a lower electrode on a substrate, a dielectric layer on the substrate, and an upper electrode on the dielectric layer. The lower electrode may include a metal nitride having a chemical formula of $M^1N_y$ ($M^1$ is a first metal, and y is a positive real number). The dielectric layer may include a metal oxide and nitrogen (N), the metal oxide having a chemical formula of $M^2O_x$ ($M^2$ is a second metal, and x is a positive real number). A maximum value of a detection amount of nitrogen (N) in the dielectric layer may be greater than a maximum value of a detection amount of nitrogen (N) in the lower electrode.

According to example embodiments of the inventive concepts, a capacitor structure may include a lower electrode on a substrate, a dielectric layer on the substrate, and an upper electrode on the dielectric layer. The lower electrode may include a metal nitride having a chemical formula of $M^1N_y$ ($M^1$ is a first metal, and y is a positive real number). The dielectric layer may include a metal oxide and nitrogen (N), the metal oxide having a chemical formula of $M^2O_x$ ($M^2$ is a second metal, and x is a positive real number). The dielectric layer may include a first portion and a second portion on the first portion, a detection amount of nitrogen in the first portion increasing from a bottom toward a top thereof, and a detection amount of nitrogen in the second portion decreasing from a bottom toward a top thereof.

According to example embodiments of the inventive concepts, a semiconductor device may include gate structures, bit line structures, contact plug structures, and a capacitor structure. The gate structures may each extend at an upper portion of a substrate in a first direction parallel to an upper surface of the substrate and may be spaced apart from each other in a second direction parallel to the upper surface of the substrate and intersecting the first direction. The bit line structures may be spaced apart from each other in the first direction and each of the bit lines may extend in the second direction on the gate structures. At least one contact plug structure may be adjacent to at least one of the bit line structures. A capacitor structure contacting an upper surface of the at least one contact plug structure may include a lower electrode, a dielectric layer, and an upper electrode sequentially stacked. The lower electrode may include a metal nitride having a chemical formula of $M^1N_y$ ($M^1$ is a first metal, and y is a positive real number). The dielectric layer may include a metal oxide and nitrogen (N), the metal oxide having a chemical formula of $M^2O_x$ ($M^2$ is a second metal, and x is a positive real number). A maximum value of a detection intensity of nitrogen in the dielectric layer may be greater than a maximum value of a detection intensity of nitrogen in the lower electrode.

According to example embodiments of the inventive concepts, a method of forming a capacitor structure may include forming a lower electrode on a substrate, providing a first metal precursor including a central metal and first and second ligands bound to the first central metal onto the lower electrode to form a first seed layer, substituting the second ligand including an amino group ($-NR^1R^2$, where $R^1$ and $R^2$ are alkyl groups having 1 to 5 carbon atoms that are equal to or different from each other) with a third ligand including an amino group ($-NH_2$) having a size smaller than that of the amino group ($-NR^1R^2$) to form a second seed layer including a second metal precursor, providing a third metal precursor including fourth and fifth ligands onto the second seed layer to form a third seed layer including the second and third metal precursors, performing an oxidation process on the third seed layer to form a dielectric layer, and forming an upper electrode on the dielectric layer.

According to example embodiments of the inventive concepts, a method of manufacturing a semiconductor device may include forming gate structures which may each extend at an upper portion of a substrate in a first direction parallel to an upper surface of the substrate and may be spaced apart from each other in a second direction parallel to the upper surface of the substrate and intersecting the first direction, forming bit line structures which may each extend in the second direction and may be spaced apart from each other in the first direction on the gate structures, forming at least one contact plug structure to be adjacent to at least one of the bit line structures and forming a capacitor structure to contact an upper surface of the at least one contact plug structure. The capacitor structure may include a lower electrode, a dielectric layer, and an upper electrode sequentially stacked. Forming the capacitor structure may include providing a first metal precursor including a central metal and first and second ligands bound to the first central metal onto the lower electrode to form a first seed layer, substituting the second ligand including an amino group ($-NR^1R^2$, where $R^1$ and $R^2$ are alkyl groups having 1 to 5 carbon atoms that are equal to or different from each other) with a third ligand including an amino group ($-NH_2$) having a size smaller than that of the amino group ($-NR^1R^2$) to form a second seed layer including a second metal precursor, providing a third metal precursor including fourth and fifth ligands onto the second seed layer to form a third seed layer including the second and third metal precursors, performing an oxidation process on the third seed layer to form a dielectric layer.

The capacitor structure according to example embodiments may include a lower electrode, a dielectric layer, and an upper electrode sequentially stacked. After forming a seed layer including a first metal precursor, an empty space may be formed in the seed layer by substituting a first ligand included in the first metal precursor with a second ligand having a size smaller than that of the first ligand and a second metal precursor may be further provided to fill the empty space. The dielectric layer may be formed by oxidizing the first and second metal precursors.

Accordingly, the dielectric layer may have an increased density, which may enhance a permittivity of the dielectric layer. The thickness of the dielectric layer may not increase even though the density of the dielectric layer increases to enhance the permittivity thereof, and thus the integration degree of a semiconductor device including the dielectric layer may not be deteriorated.

DETAILED DESCRIPTION

The above and other aspects and features of a semiconductor device including a capacitor structure and a method of manufacturing the same in accordance with example embodiments will become readily understood from detail descriptions that follow, with reference to the accompanying drawings.

Hereinafter, two directions substantially parallel to an upper surface of a substrate and substantially perpendicular to each other may be defined as first and second directions, respectively.

FIGS. 1 to 12 are cross-sectional views illustrating a method of forming a capacitor structure according to example embodiments. Specifically, FIGS. 1-4, 7, 9, and 11 are cross-sectional views, and FIGS. 5, 6, 8, 10, and 12 are enlarged cross-sectional views of X regions of corresponding cross-sectional views, respectively. FIGS. 5, 6, 8, 10, and 12 illustrate structures of components that are not visual, for the convenience of explanation.

Figure 1:
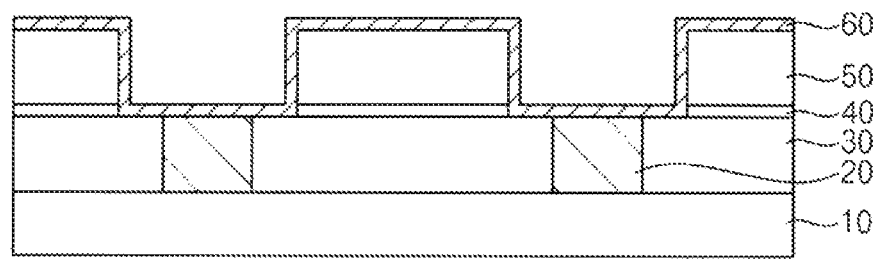
FIGS. 1 to 12 are cross-sectional views illustrating a method of forming a capacitor structure according to example embodiments.

Referring to FIG. 1, a first insulating interlayer 30 containing a contact plug 20 therein may be formed on a substrate 10, and an etch stop layer 40 and a mold layer 50 may be sequentially stacked on the first insulating interlayer 30 and the contact plug 20. The etch stop layer 40 and the mold layer 50 may be partially etched to form a first opening exposing an upper surface of the contact plug 20 and an upper surface of a portion of the first insulating interlayer 30 adjacent thereto. A lower electrode layer 60 may be formed on the upper surfaces of the contact plug 20 and the portion of the first insulating interlayer 30 exposed by the first opening, a sidewall of the first opening, and an upper surface of the mold layer 50.

The substrate 10 may include silicon, germanium, silicon-germanium, or a III-V group compound semiconductor, such as GaP, GaAs, or GaSb. In example embodiments, the substrate 10 may be a silicon-on-insulator (SOI) wafer or a germanium-on-insulator (GOI) wafer.

Various types of elements, e.g., an active pattern, a gate structure, a bit line structure, a source/drain layer, etc., may be formed on the substrate 10. The elements may be covered by the first insulating interlayer 30, and the contact plug 20 may be electrically connected to, for example, the source/drain layer.

The contact plug 20 may include, e.g., a metal such as tungsten (W), aluminum (Al), copper, etc., and/or polysilicon doped with impurities. The first insulating interlayer 30 may include, e.g., an oxide such as silicon oxide. The lower electrode layer 60 may include, e.g., a metal nitride.

In an example embodiment, the lower electrode layer 60 may be formed by forming and nitriding a metal layer.

The etch stop layer 40 and the mold layer 50 sequentially stacked may include respective materials having an etch selectivity with respect to each other, for example, an oxide such as silicon oxide and a nitride such as silicon nitride, respectively.

In example embodiments, a plurality of contact plugs 20 may be formed to be spaced apart from each other in each of the first and second directions, and may be arranged in a honeycomb shape in a plan view. Each of the contact plugs 20 may have a circular, elliptical or polygonal shape in a plan view.

Figure 2:
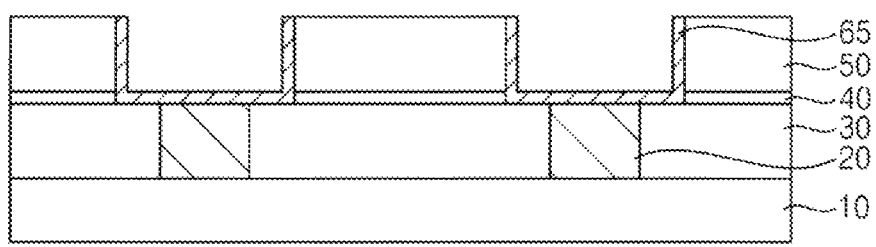

Referring to FIG. 2, a sacrificial layer (not shown) may be formed on the lower electrode layer 60 to fill the first opening, and the sacrificial layer and the lower electrode layer 60 may be planarized until the upper surface of the mold layer 50 is exposed so that the lower electrode layer 60 may be divided into a plurality of lower electrodes 65. Each of the lower electrodes 65 may have a cup-like shape.

Figure 3:
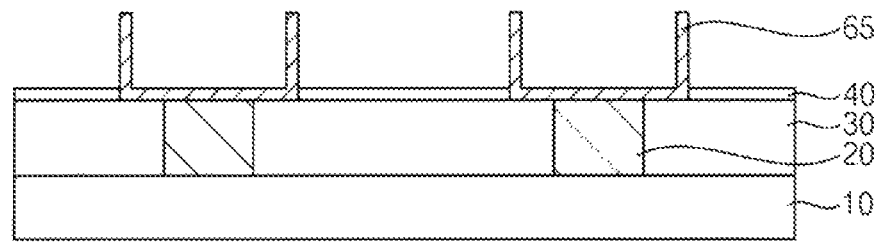

Referring to FIG. 3, the sacrificial layer and the mold layer 50 may be removed.

The lower electrode 65 may be formed on the upper surfaces of the contact plug 20 and the portion of the first insulating interlayer 30 adjacent thereto, and an upper surface of the etch stop layer 40 may be exposed. In example embodiments, the sacrificial layer and the mold layer 50 may be removed by a wet etching process.

Alternatively, the lower electrode 65 may be formed in a pillar shape.

Figure 4:
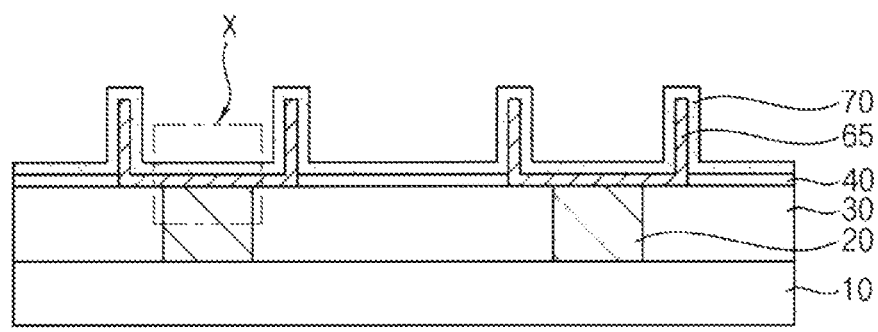
Figure 5:
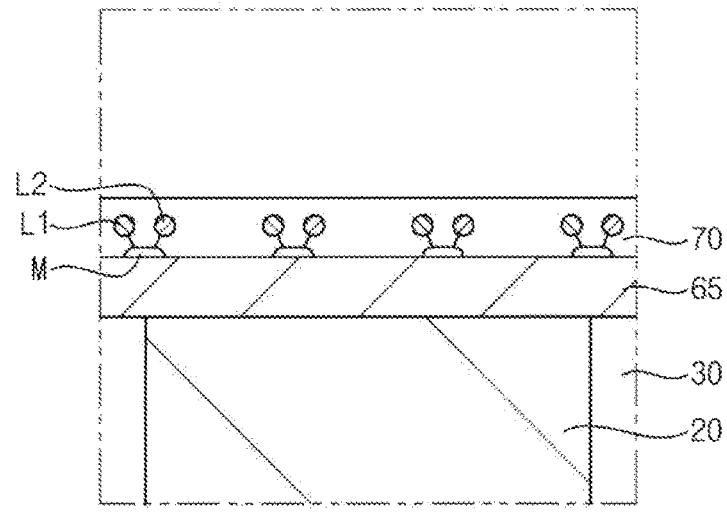

Referring to FIGS. 4 and 5, a first seed layer 70 may be conformally formed on the upper surface of the etch stop layer 40 and an upper surface and a sidewall of the lower electrode 65.

The first seed layer 70 may include, for example, a first metal precursor having a chemical formula of $MC_xN_y$ (M is a central metal, C is carbon, N is nitrogen, and x and y are positive real numbers). In example embodiments, the central metal M may include at least one selected from a group consisting of Li, Be, B, Na, Mg, Al, K, Ca, Sc, Ti, V, Cr, Mn, Fe, Co, Ni, Cu, Zn, Ga, Ge, Rb, Sr, Y, Zr, Vb, Mo, Tc, Ru Rh, Pd, Ag, Cd, In, Sn, Sb, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Pb, Bi, Po, Fr, Ra and Ac.

The first metal precursor included in the first seed layer 70 may be represented by a general formula of $M(L1)_n(L2)_m$ (n and m are positive real numbers), where M is the central metal, and L1 and L2 are different ligands bound to the central metal M. Hereinafter, L1 may be referred to as a first ligand, L2 may be referred to as a second ligand, and L3 and L4 described later may be referred to as a third ligand and a fourth ligand, respectively.

The first ligand L1 may be an alkyl group having 1 to 5 carbon atoms, or an aromatic cyclic group or a heterocyclic group having 4 or more carbon atoms, and when the cyclic group has a substituent, the substituent may include at least one alkyl group such as a methyl group, an ethyl group, etc.

The second ligand L2 may be an amino group or a nitrogen group including the amino group, and the amino group may include at least one alkyl group such as a methyl group and an ethyl group each of which is independently bonded to one nitrogen atom. Accordingly, the amino group included in the second ligand L2 may be represented by a general formula of $-NR^1R^2$, where $R^1$ and $R^2$ are independently alkyl groups having 1 to 5 carbon atoms. $R^1$ and $R^2$ may also be independently H, an alkyl group having greater than 6 carbon atoms, an aryl group (an aromatic cyclic group), or a heterocyclic group having 4 or more carbon atoms.

In one embodiment, the first ligand L1 may be a cyclopentane, and the second ligand L2 may be a dimethylamine. The terms "amine", "amine group", "amido", "amido group", "amino" and "amino group" as used herein refer to a group where a hydrogen is removed from ammonia ($NH_3$), or from the nitrogen of a primary amine compound ($R'NH_2$) or from the nitrogen of a secondary amine compound ($R'R''NH$), where R' and R'' are organic groups. A primary amino group may be represented by the structural formula $-NH_2$, a secondary amino group may be represented by the structural formula $-NR'H$ and a tertiary amino group may be represented by the structural formula $-NR'R''$.

FIG. 5 shows that a plurality of first metal precursors including the central metal M and the first and second ligands L1 and L2 is formed on the upper surface of the lower electrode 65 in the first seed layer 70, however, the inventive concept may not be limited thereto, and the plurality of the first metal precursors may be formed to be spaced apart from the upper surface of the lower electrode 65.

FIG. 5 shows that the central metal M has a size smaller than those of the first and second ligands L1 and L2, and the first ligand L1 and the second ligand L2 have a similar size in the first metal precursor, however, the inventive concept may not be limited thereto, and the central metal M and the first and second ligands L1 and L2 may have other sizes. That is, FIG. 5 shows structures of components that are not visual, and real sizes of the components may not be limited thereto. By "size" it is meant the physical space occupied by the ligand.

In example embodiments, the first seed layer 70 may be formed by, for example, a chemical vapor deposition (CVD) process, an atomic layer deposition (ALD) process, or a physical vapor deposition (PVD) process.

Figure 6:
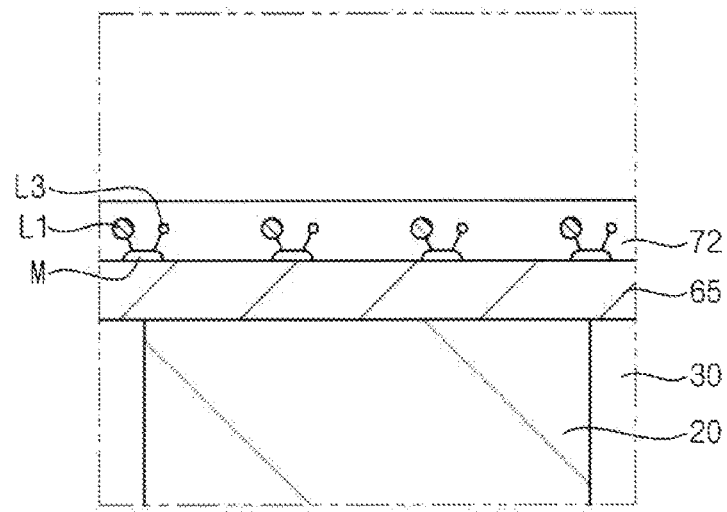

Referring to FIG. 6, a surface of the first seed layer 70 may be cleaned by a cleaning process using nitrogen ($N_2$) gas, and the second ligand L2 bound to the first metal precursor may be substituted with the third ligand L3. The third ligand L3 may include an amino group ($-NH_2$) having a size smaller than that of the amino group ($-NR^1R^2$) included in the second ligand L2. Ligand L3 may also be an amino group $-NR^1H$ or $-NR^2H$ where ligand L3 is smaller than ligand L2. $R^1$ and $R^2$ can be organic groups as mentioned herein above, such as a methyl or ethyl group.

Specifically, the substitution reaction may be performed by providing ammonia ($NH_3$) gas onto the cleaned first seed layer 70. An acidity of a primary amine ($NH_2R$) is greater than an acidity of an secondary amine ($NHR^1R^2$), that is, a reactivity of the primary amine ($NH_2R$) is greater than that of the secondary amine ($NHR^1R^2$), so that the amino group ($-NH_2$) may contain two hydrogen atoms (H) bound to one nitrogen atom. Thus, the second ligand L2 having the amino group bound to the central metal M of the first metal precursor may be substituted with the third ligand L3 having the amino group ($-NH2$). Accordingly, the first metal precursor may be converted to a second metal precursor represented by a general formula of $M(L1)_n(L3)_1$, and the first seed layer 70 may be converted to a second seed layer 72.

FIG. 6 shows that the second ligand L2 bound to the central metal M of the first metal precursor is entirely substituted with the third ligand L3, however, the inventive concept may not be limited thereto. That is, the second ligand L2 may not be entirely substituted with the third ligand L3, but may partially remain, which may be bound to the central metal M of the second metal precursor.

In example embodiments, the first ligand L1 bound to the first metal precursor may be also substituted with a third ligand L3. In this case, the third ligand L3 may include an amino group ($-NH_2$, $NR^1H$ or $-NR^2H$) or a nitrogen-containing group including an amino group ($-NH_2$). and having a smaller size than the first ligand L1.

Figure 7:
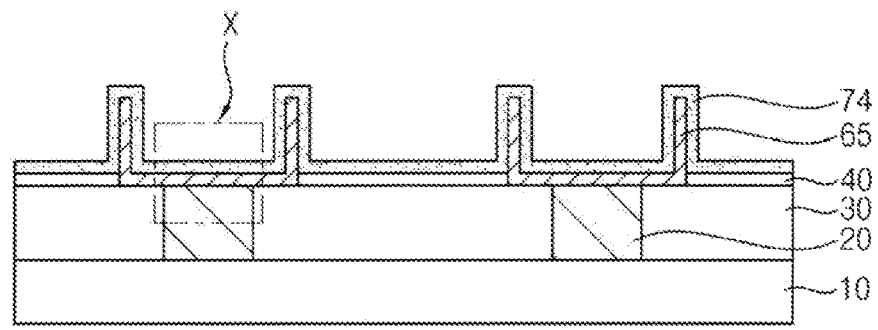
Figure 8:
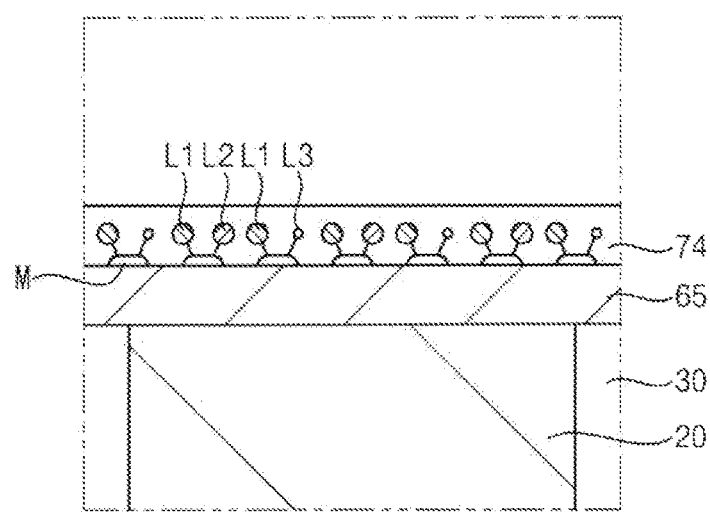

Referring to FIGS. 7 and 8, the first metal precursor may be further provided onto the second seed layer 72 to form a third seed layer 74.

As the third ligand L3 having a size smaller than that of the second ligand L2 is bound to the central metal M, an empty space for containing the first metal precursor may be formed in the second seed layer 72. Accordingly, the first metal precursor may be provided onto the second seed layer 72 to fill the empty space, and the second seed layer 72 may be converted to the third seed layer 74 having a density greater than that of the second seed layer 72.

In example embodiments, the third seed layer 74 may include the first metal precursor having the general formula of $M(L1)_n(L2)_m$ and the second metal precursor having the general formula of $M(L1)_n(L3)_1$ (n and 1 are positive real numbers). In one embodiment, the third seed layer 74 may have a density greater than that of each of the first and second seed layers 70 and 72.

In some embodiments, a third metal precursor having a composition different from that of the first metal precursor may be provided onto the second seed layer 72 instead of providing the first metal precursor onto the second seed layer 72, to form the third seed layer 74.

In example embodiments, the third metal precursor may include a central metal different from the central metal M included in the first metal precursor, and may include ligands different from the first and second ligands L1 and L2 bound to the central metal M of the first metal precursor. Alternatively, the third metal precursor may include the same central metal as the central metal M of the first metal precursor, but may include the ligands different from the first and second ligands L1 and L2 of the first metal precursor. Alternatively, the third metal precursor may include the central metal different from the central metal M of the first metal precursor, but may include the same ligands as the first and second ligands L1 and L2 of the first metal precursor.

In one embodiment, the central metal included in the first metal precursor may be aluminum (Al) or zirconium (Zr), and the central metal included in the third metal precursor may be zirconium (Zr) or aluminum (Al).

Hereinafter, for the convenience of explanation, only the case in which the third seed layer 74 includes only the first and second metal precursors having the same central metal M, and does not include the third metal precursor having the different central metal from the first and second metal precursors will be described.

Figure 9:
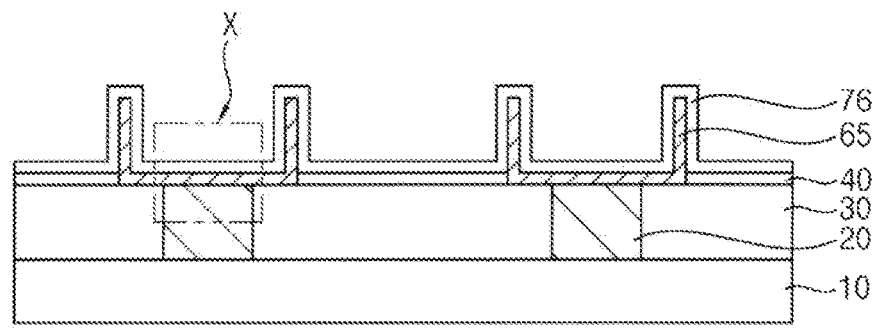
Figure 10:
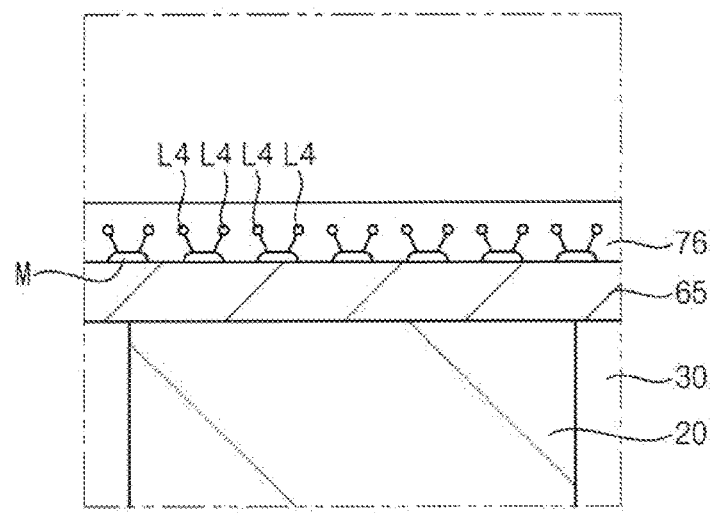

Referring to FIGS. 9 and 10, the third seed layer 74 may be oxidized to form a dielectric layer 76.

Specifically, the oxidation process may be performed by using ozone ($O_3$) gas or ozone ($O_3$) plasma, and each of the first to third ligands L1, L2, and L3 included in the third seed layer 74 may be substituted with oxygen (O). Accordingly, the third seed layer 74 including the first and second metal precursors may be converted to the dielectric layer 76 including a metal oxide. The oxygen (O) component included in the dielectric layer 76 may be referred to as a fourth ligand L4 bound to the central metal M, and two oxygen (O) atoms may be bonded with one central metal (M) to form the metal oxide having a chemical formula of $MO_2$.

FIG. 10 shows that the first to third ligands L1, L2, and L3 bound to the central metal M of the first and second metal precursors are entirely substituted with oxygen (O), however, the inventive concept may not be limited thereto. That is, some of the first to third ligands L1, L2, and L3 may not be substituted with oxygen (O) to remain, and may be bound to the central metal M of the first and second metal precursors.

Figure 11:
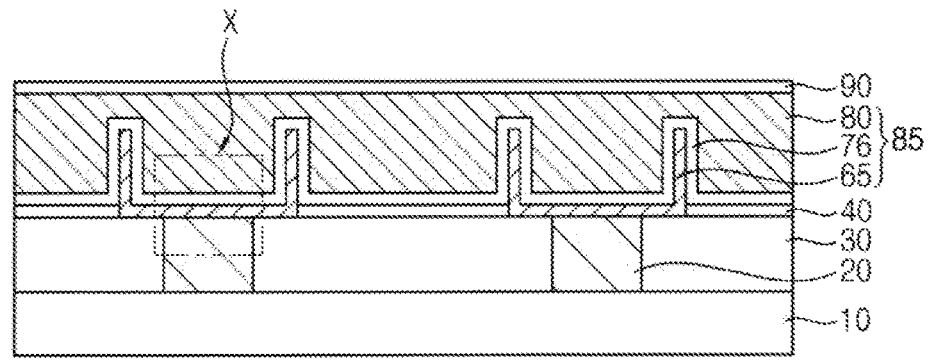
Figure 12:
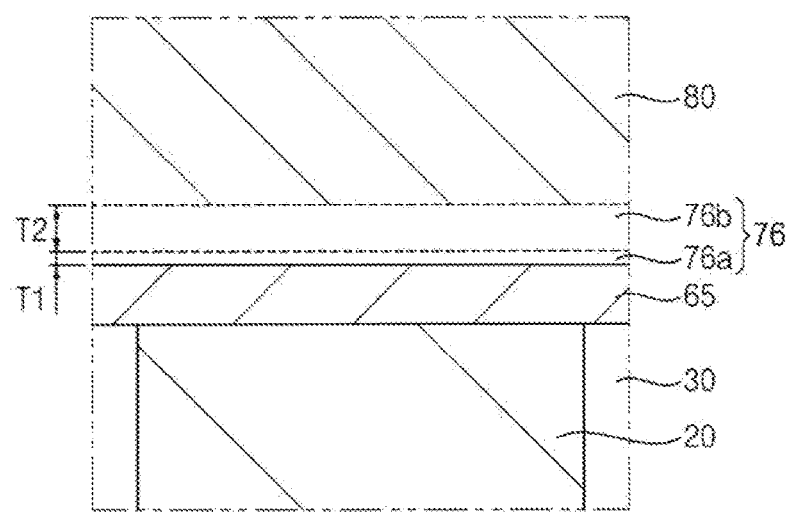

Referring to FIGS. 11 and 12, an upper electrode 80 may be formed on the dielectric layer 76 to complete the formation of a capacitor structure 85 including the lower electrode 65, the dielectric layer 76 and the upper electrode 80 sequentially stacked on the contact plug 20, and a second insulating interlayer 90 may be further formed to cover the capacitor structure 85.

In example embodiments, the upper electrode 80 may be formed to include a different material from the lower electrode 65, for example, doped polysilicon and a metal. Alternatively, the upper electrode 80 may be formed to include the same material as the lower electrode 65, for example, a metal nitride. The second insulating interlayer 90 may include, for example, an oxide such as silicon oxide.

The lower electrode 65 and the dielectric layer 76 may include a metal nitride and the metal oxide, respectively. The metal nitride included in the lower electrode 65 may be represented by a chemical formula of $M^1N_y$ ($M^1$ is a first metal, and y is a positive real number), and the metal oxide included in the dielectric layer 76 may be represented by a chemical formula of $M^2O_x$ ($M^2$ is a second metal, and x is a positive real number). The first metal $M^1$ and the second metal $M^2$ may be the same as or different from each other. In one embodiment, the lower electrode 65 may include TiN, and the dielectric layer 76 may include AlO and/or ZrO.

The second and third ligands L2 and L3 among the first to third ligands L1, L2 and L3, which may include a nitrogen (N) component, that is, the amino group (—$NR^1R^2$) and the amino group (—$NH_2$), respectively, may partially remain on the second metal $M^2$ included in the dielectric layer 76, and thus the nitrogen (N) component may be detected at least in a lower portion of the dielectric layer 76. The lower electrode 65 and the dielectric layer 76 may be formed to have substantially the same thickness or similar thickness to each other. Unlike the lower electrode 65 that may be formed by forming and nitriding a metal layer, the dielectric layer 76 may be formed by additionally providing and oxidizing the first metal precursor, so that an amount of the nitrogen (N) component included in the dielectric layer 76 may be greater than an amount of a nitrogen (N) component included in the lower electrode 65. In example embodiments, a maximum value of a detection intensity or detection amount of the nitrogen (N) component included in the dielectric layer 76 may be greater than a maximum value of a detection intensity or detection amount of the nitrogen (N) component included in the lower electrode 65.

In example embodiments, the dielectric layer 76 may include first and second portions 76a and 76b sequentially stacked on the lower electrode 65, which may have first and second thicknesses T1 and T2, respectively. The second thickness T2 may be greater than the first thickness T1. Since the third seed layer 74 may be formed by further providing the first metal precursor to fill the empty space formed on the second seed layer 72, an amount of the second and third ligands included in a portion of the third seed layer 74 where the empty space is filled with the first metal precursor may be greater than that of other portions of the third seed layer 74. Since the portion of the third seed layer 74 where the empty space is filled with the first metal precursor may become a portion including a boundary between the first portion 76a and the second portion 76b of the dielectric layer by being oxidized, the detection intensity or detection amount of the nitrogen (N) component included in the dielectric layer 76 may have the maximum value between a bottom surface and a central portion thereof, particularly, at the boundary between the first portion 76a and the second portion 76b, and the first portion 76a of the dielectric layer 76 may be a portion in which the detection intensity or detection amount of the nitrogen (N) component included therein is increased from a bottom toward a top thereof. Since the third seed layer 74 may be exposed to oxygen more from a bottom surface toward an upper surface thereof, the second portion 76b of the dielectric layer 76 may be a portion in which the detection intensity or detection amount of the nitrogen (N) component included therein is decreased from a bottom toward a top thereof, and the detection intensity or detection amount of the nitrogen (N) component included in the dielectric layer 76 may have a minimum value on the upper surface of the dielectric layer 76.

In example embodiments, since a part of the nitrogen (N) component included in the dielectric layer 76 may diffuse to the lower electrode 65, the detection intensity or detection amount of the nitrogen (N) component included in the lower electrode 65 may have the maximum value at an upper surface of the lower electrode 65, and a value gradually increasing from the bottom surface toward the upper surface thereof.

As described above, after forming the first seed layer 70 including the first metal precursor, the second seed layer 72 may be formed by substituting the second ligand L2 including an amino group (—$NR^1R^2$) among ligands bound to the central metal M of the first metal precursor with the third ligand L3 including an amino group (—$NH_2$), and the third seed layer 74 may be formed by further providing the first metal precursor onto the second seed layer 72.

As the third ligand L3 having a size smaller than that of the second ligand L2 is bound to the central metal M, an empty space for containing the first metal precursor may be formed in the second seed layer 72, and thus the first metal precursor may be further provided to fill the empty space so that the third seed layer 74 having a density greater than that of the second seed layer 72 may be formed.

The third seed layer 74 having the increased density may be oxidized to form the dielectric layer 76 including the metal oxide, and thus the dielectric layer 76 may have an increased density, which may enhance a permittivity of the dielectric layer 76.

The thickness of the dielectric layer 76 may not increase even though the density of the dielectric layer 76 increases to enhance the permittivity thereof, and thus the integration degree of the semiconductor device including the dielectric layer 76 may not be deteriorated.

An amino group may be bound in an order of M—N—C—H (M is the central metal, N is nitrogen, C is carbon, and H is hydrogen), and thus ozone ($O_3$) may attack at least three points thereof. However, an amino group may be bound in an order of M—N—H, and thus ozone ($O_3$) may attack two points at most. Accordingly, the oxidation process may be more effectively performed on the third ligand L3 bound to the central metal M, which may include the amino group, than on the second ligand L2 bound to the central metal M, which may include the amino group. In addition, a binding energy of N—H (about 339 kJ/mol) is less than that of N—C (about 748 kJ/mol), and thus the oxidation process may be further accelerated in the third ligand L3.

Figure 13:
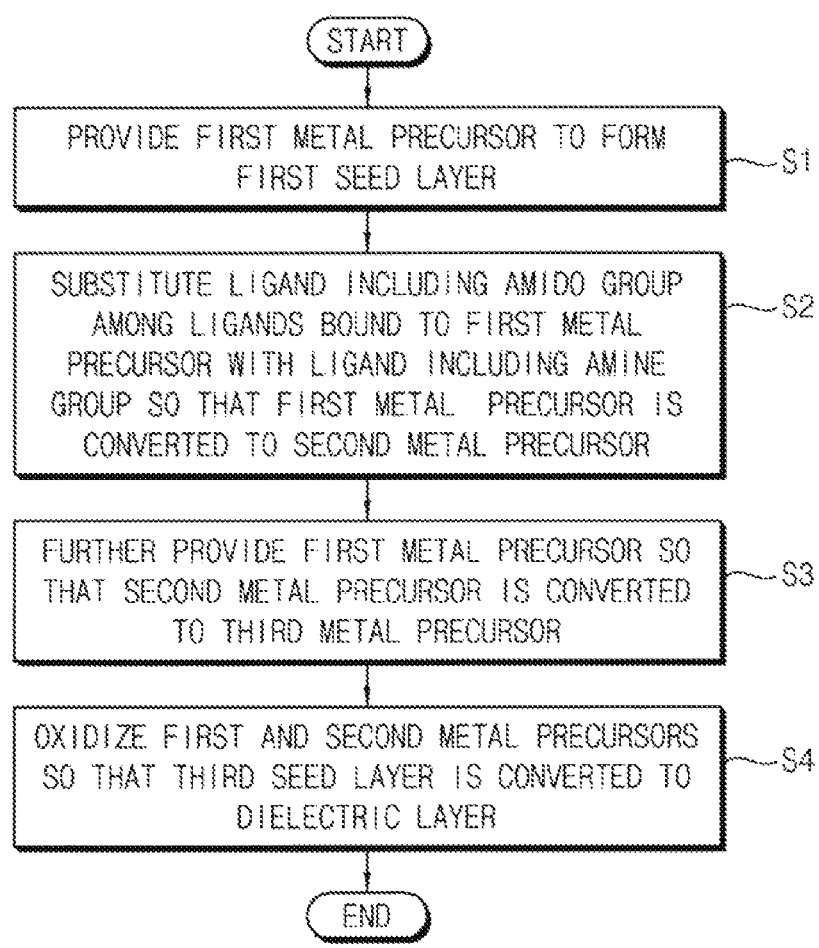
FIG. 13 is a flowchart illustrating a method of forming a dielectric layer according to example embodiments.

FIG. 13 is a flowchart illustrating a method of forming a dielectric layer 76 according to example embodiments.

Referring to FIG. 13, the method of forming the dielectric layer 76 may include a step S1 in which a first metal precursor may be provided to form a first seed layer, a step S2 in which a ligand including an amino group among ligands bound to the first metal precursor may be substituted with a ligand including an amino group to form a second metal precursor so that the first seed layer may be converted to a second seed layer, a step S3 in which the first metal precursor may be further provided so that the second seed layer may be converted to a third seed layer, and a step S4 in which an oxidation process may be performed on the first and second metal precursors so that the third seed layer may be converted to the dielectric layer 76.

In example embodiments, the steps S1 to S3 may be performed repeatedly before performing the step S4.

FIGS. 14 to 32 are plan views and cross-sectional views illustrating steps of a method of manufacturing a semiconductor device in accordance with example embodiments. Specifically, FIGS. 14, 16, 24, and 30 are the plan views, and FIGS. 15, 17-23, 25-29 and 31-32 are the cross-sectional views. Each of FIGS. 15, 17-23, 25-29 and 31-32 includes cross-sectional views taken along lines A-A' and B-B' of corresponding plan views, respectively.

This method includes processes substantially the same as or similar to those described with reference to FIGS. 1 to 13, and thus repeated descriptions thereon are omitted herein.

Figure 14:
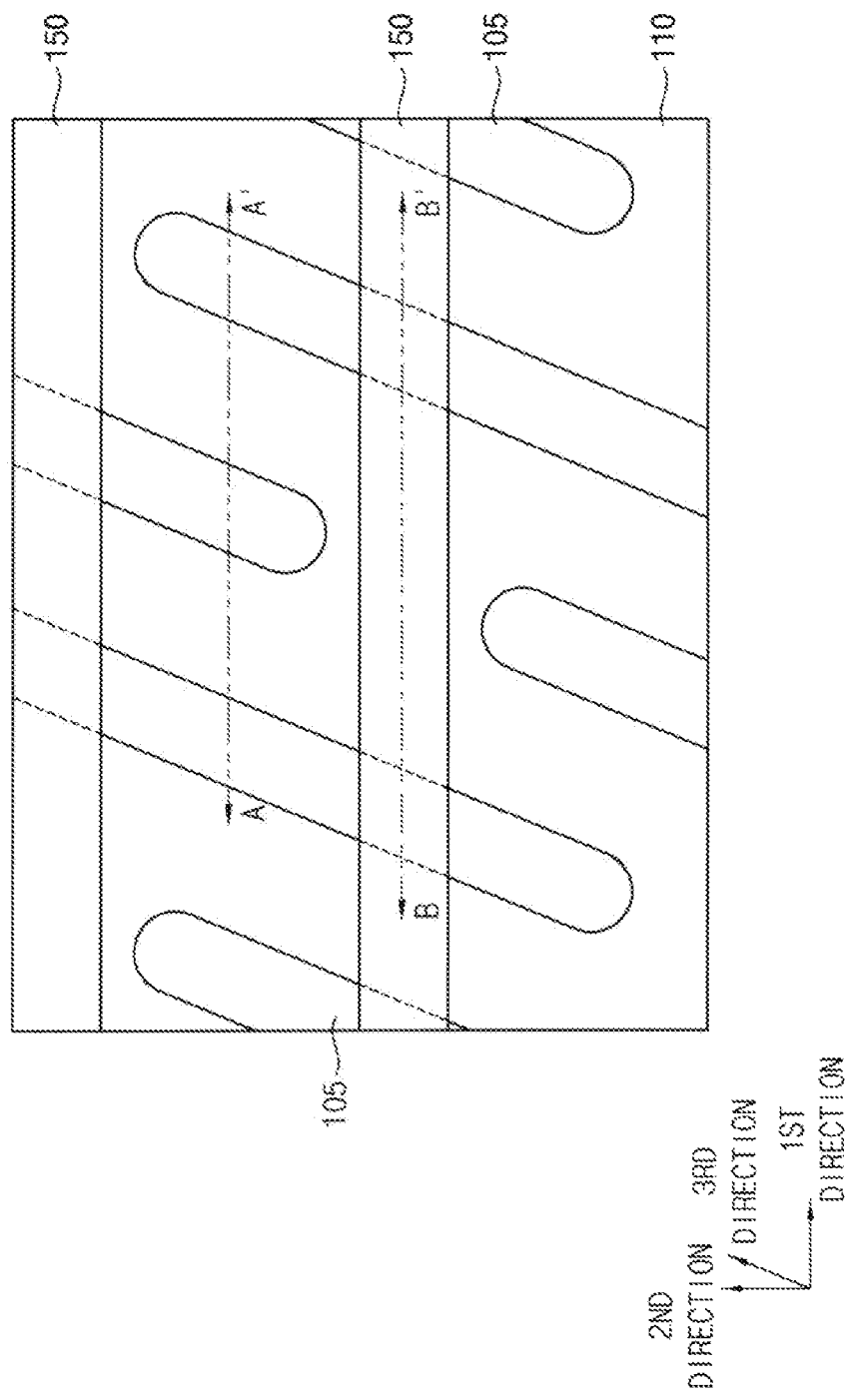
FIGS. 14 to 32 are plan views and cross-sectional views illustrating steps of a method of manufacturing a semiconductor device in accordance with example embodiments.
Figure 15:
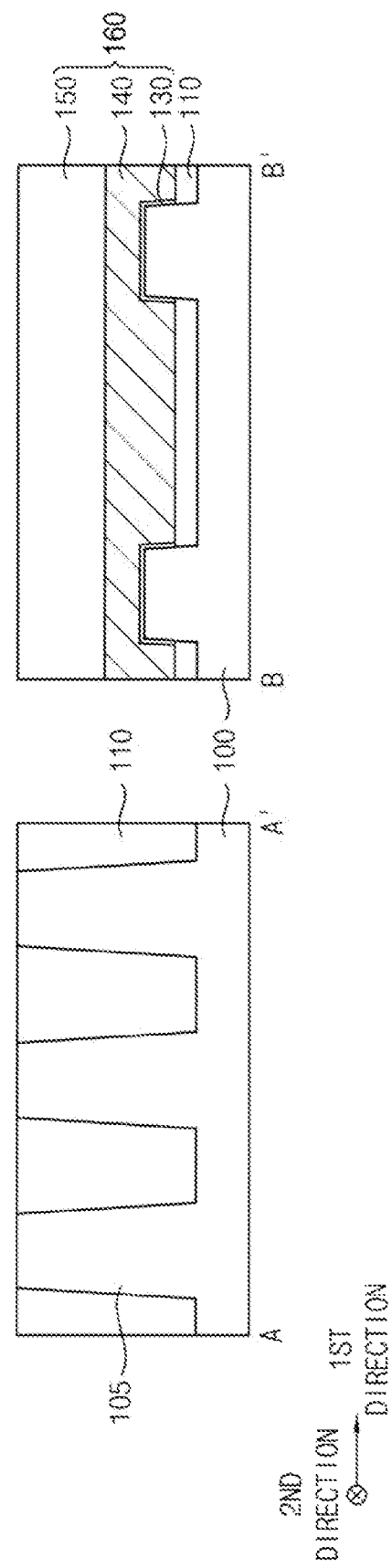

Referring to FIGS. 14 and 15, an active pattern 105 may be formed on a substrate 100, and an isolation pattern 110 may be formed to cover a sidewall of the active pattern 105.

In example embodiments, a plurality of active patterns 105 may be formed to be spaced apart from each other in each of a first and second directions, which are parallel to an upper surface of the substrate 100 and are orthogonal to each other, and each of the active patterns 105 may extend in a third direction that is parallel to the upper surface of the substrate 100 and is at an acute angle with the first and second directions.

The active pattern 105 may be formed by removing an upper portion of the substrate 100 to form a first recess, and the isolation pattern 110 may be formed by forming an isolation layer on the substrate 100 to fill the first recess and planarizing the isolation layer until an upper surface of the active pattern 105 is exposed. In example embodiments, the planarization process may include a chemical mechanical polishing (CMP) process and/or an etch back process.

An impurity region (not shown) may be formed at an upper portion of the substrate 100 by, e.g., an ion implantation process, and the active pattern 105 and the isolation layer pattern 110 may be partially etched to form a second recess extending in the first direction, and a gate structure 160 may be formed in the second recess.

The gate structure 160 may be formed to include a gate insulating layer 130 on the active pattern 105 exposed by the second recess, a gate electrode 140 on the gate insulating layer 130, which may fill a lower portion of the second recess, and a gate mask 150 on the gate electrode 140, which may fill an upper portion of the second recess. The gate structure 160 may extend along the first direction, and a plurality of gate structures 160 may be formed to be spaced apart from each other along the second direction.

In example embodiments, the gate insulating layer 130 may be formed by a thermal oxidation process on the active pattern 105 exposed by the second recess, and thus may be formed to include an oxide, e.g., silicon oxide.

The gate electrode 140 may be formed by forming a gate electrode layer on the gate insulating layer 130 and the isolation pattern 110 to fill the second recess, and removing an upper portion of the gate electrode layer by a CMP process and/or an etch back process. Accordingly, the gate electrode 140 may be formed in the lower portion of the second recess. The gate electrode layer may be formed of, e.g., a metal such as tungsten (W), titanium (Ti), or tantalum (Ta), or a metal nitride such as tungsten nitride, titanium nitride, or tantalum nitride.

The gate mask 150 may be formed by forming a gate mask layer on the gate electrode 140, the gate insulating layer 130, and the isolation pattern 110 to fill a remaining portion of the second recess, and planarizing an upper portion of the gate mask layer until an upper surface of the isolation pattern 110 is exposed. Accordingly, the gate mask 150 may be formed in the upper portion of the second recess. The gate mask layer may be formed to include a nitride, e.g., silicon nitride.

Figure 16:
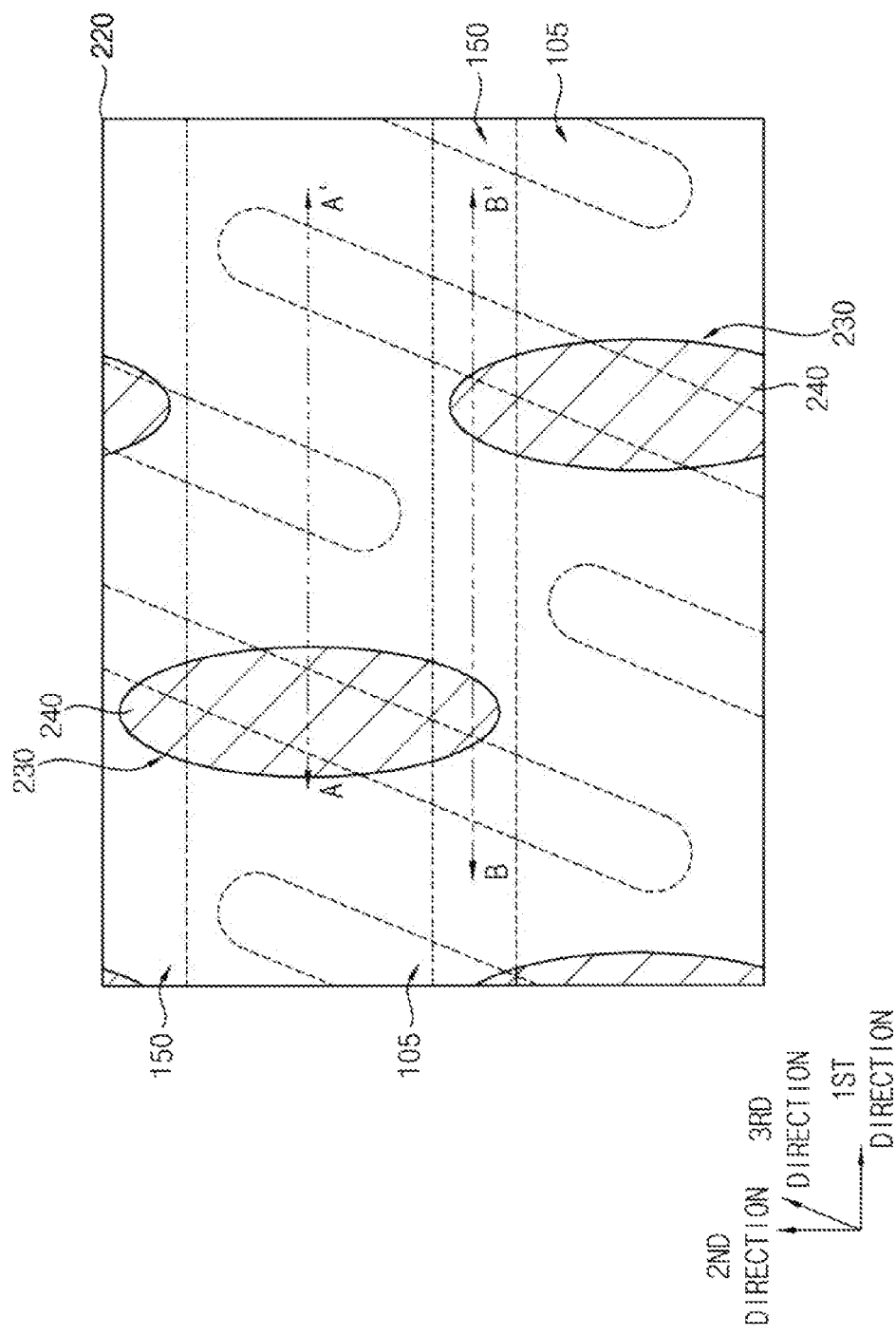
Figure 17:
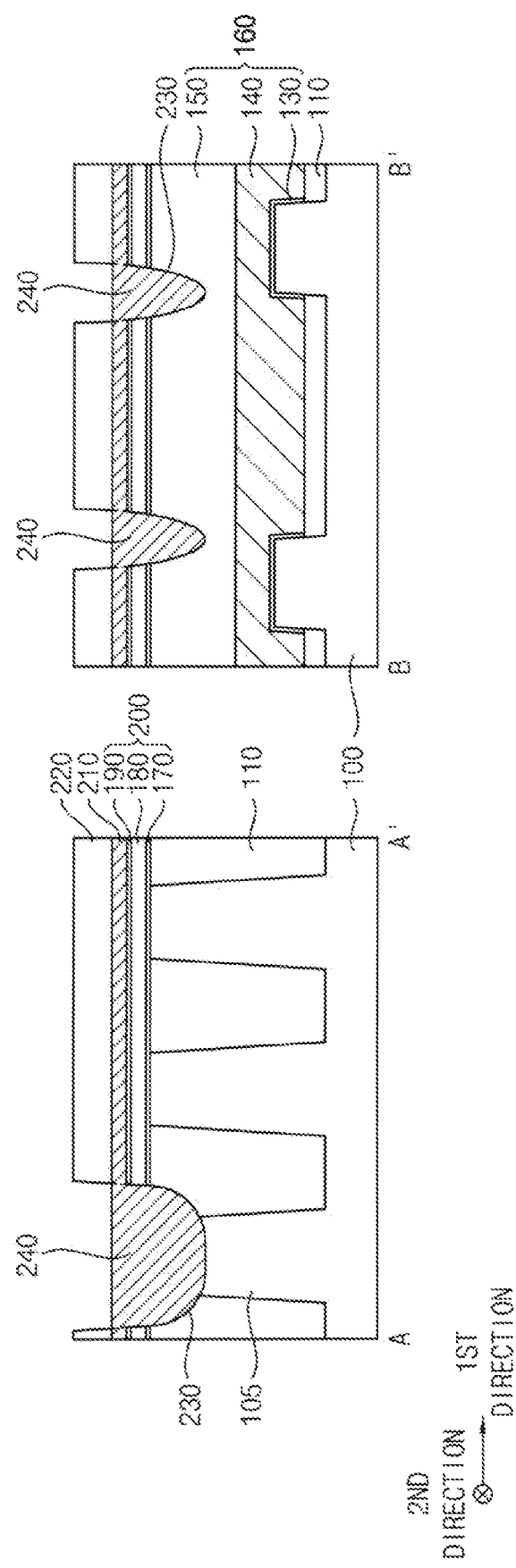

Referring to FIGS. 16 and 17, an insulating layer structure 200, a first conductive layer 210, and a first etching mask 220 may be sequentially formed on the gate structure 160. The first conductive layer 210 and the insulating layer structure 200 may be etched using the first etching mask 220 to form a second opening 230 exposing an upper surface of the active pattern 105.

In example embodiments, the insulating layer structure 200 may include first to third insulating layers 170, 180, and 190 sequentially stacked. The first insulating layer 170 may be formed of, e.g., an oxide such as silicon oxide, and the second insulating layer 180 may be formed of, e.g., a nitride such as silicon nitride, and the third insulating layer 190 may be formed of, e.g., an oxide such as silicon oxide.

The first conductive layer 210 may be formed to include, e.g., polysilicon doped with impurities, and the first etching mask 220 may be formed to include, e.g., a nitride such as silicon nitride.

During the etching process, an upper portion of the active pattern 105 and an upper portion of the isolation pattern 110 adjacent thereto, which are exposed by the second opening 230, and an upper portion of the gate mask 150 may be etched to form a third recess 230. That is, a bottom of the second opening 230 may be also referred to as the third recess 230.

In example embodiments, the second opening 230 may expose an upper surface of a central portion of each active pattern 105 extending in the third direction, and thus a plurality of second openings 230 may be formed in each of the first and second directions.

A second conductive layer 240 may be formed to fill the second opening 230.

In example embodiments, the second conductive layer 240 may be formed by forming a preliminary second conductive layer on the active pattern 105, the isolation pattern 110, the gate mask 150 and the first etching mask 220 to fill the second opening 230, and planarizing an upper portion of the preliminary second conductive layer. Accordingly, the second conductive layer 240 may be formed to have an upper surface substantially coplanar with an upper surface of the first conductive layer 210.

In example embodiments, a plurality of second conductive layers 240 may be formed in each of the first and second directions to be spaced apart from each other. The second conductive layer 240 may be formed to include, e.g., polysilicon doped with impurities, and in some embodiments, may be merged with the first conductive layer 210.

Figure 18:
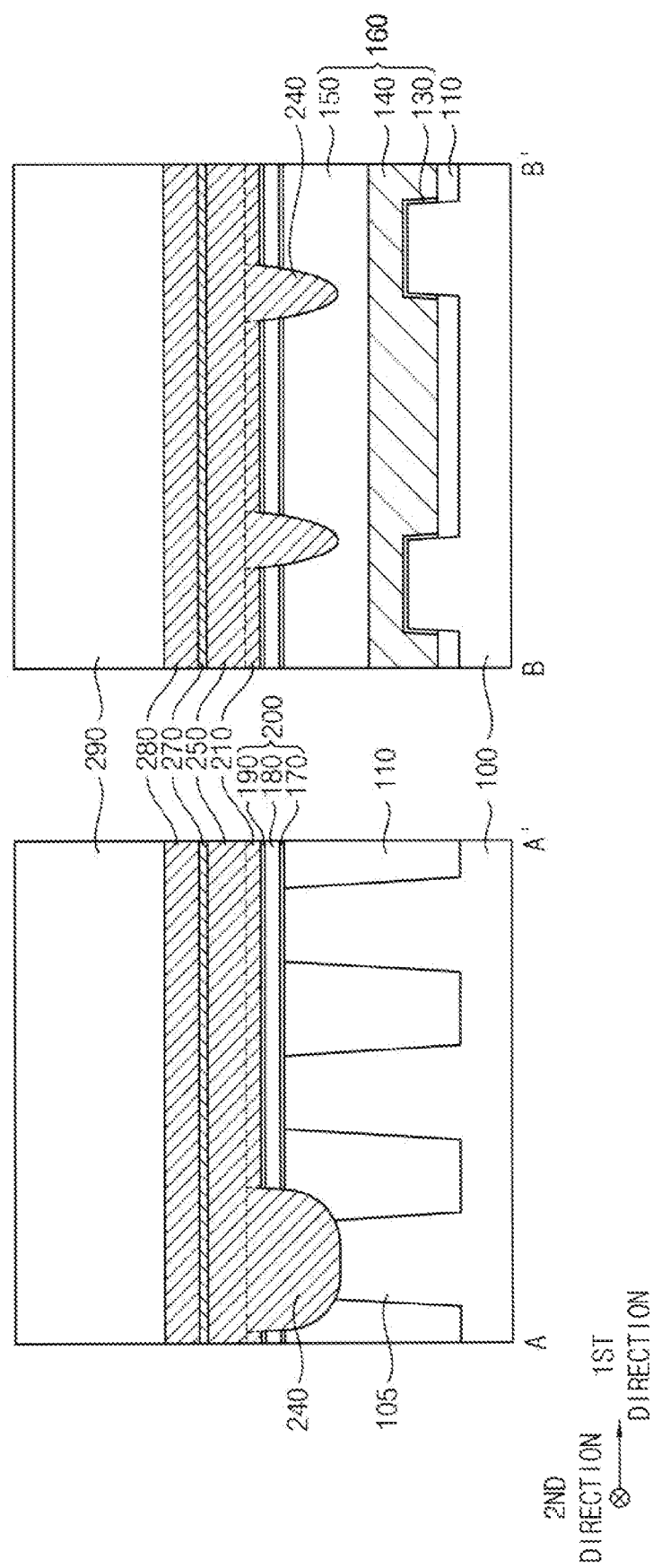

Referring to FIG. 18, after removing the first etching mask 220, a third conductive layer 250, a barrier layer 270, a first metal layer 280, and a first capping layer 290 may be sequentially formed on the first and second conductive layers 210 and 240.

In example embodiments, the third conductive layer 250 may be formed to include substantially the same material as the first and second conductive layers 210 and 240. That is, the third conductive layer 250 may be formed to include polysilicon doped with impurities, and in some embodiments, may be merged with the first and second conductive layers 210 and 240.

The barrier layer 270 may be formed to include, e.g., a metal such as titanium (Ti), tantalum (Ta), etc, and/or a metal nitride such as titanium nitride, tantalum nitride, etc. The first metal layer 280 may be formed to include, e.g., a metal such as tungsten (W). The first capping layer 290 may be formed to include, e.g., a nitride such as silicon nitride.

Figure 19:
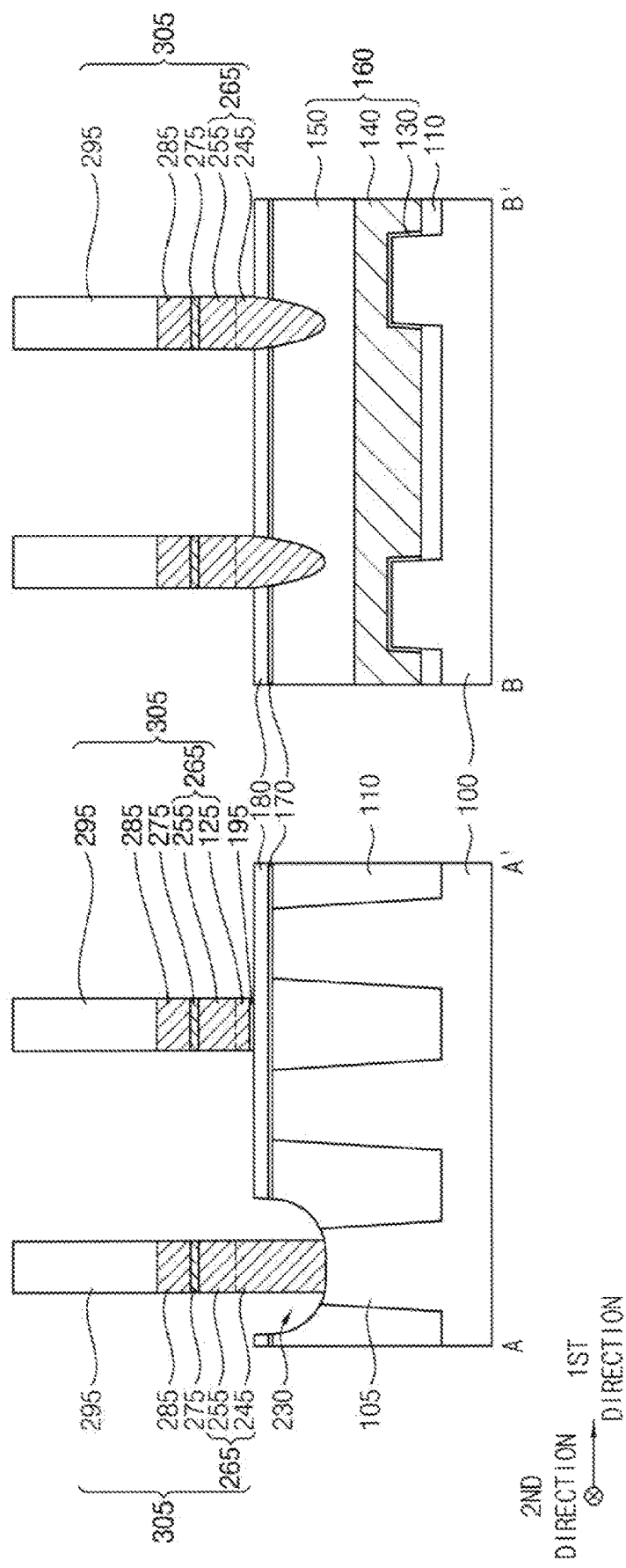

Referring to FIG. 19, the first capping layer 290 may be etched to form a first capping pattern 295, and the first metal layer 280, the barrier layer 270, the third conductive layer 250, and the first and second conductive layers 210 and 240 may be sequentially etched using the first capping pattern 295 as an etching mask. During the etching process, the third insulating layer 190 at an uppermost level of the insulating layer structure 200 may be also etched.

Accordingly, a second conductive pattern 245, a third conductive pattern 255, a barrier pattern 275, a first metal pattern 285, and the second capping pattern 295 may be sequentially stacked on the active pattern 105, the isolation pattern 110, and the gate mask 150 in the second opening 230, and a third insulating pattern 195, the first conductive pattern 215, the third conductive pattern 255, the barrier pattern 275, the first metal pattern 285, and the first capping pattern 295 may be sequentially stacked on the second insulating layer 180 of the insulating layer structure 200 at an outside of the first opening 230.

In some embodiments, the first to third conductive layers 210, 240, and 250 may be merged with each other, and thus the second and third conductive patterns 245 and 255 sequentially stacked may form a conductive pattern structure 265, and also the first and third conductive layers 215 and 255 sequentially stacked may form the conductive pattern structure 265. Hereinafter, the conductive pattern structures 265, the barrier pattern 275, the first metal pattern 285, and the first capping pattern 295 sequentially stacked may be referred to as a bit line structure 305.

In example embodiments, the bit line structure 305 may extend in the second direction, and a plurality of bit line structures 305 may be formed in the first direction.

Figure 20:
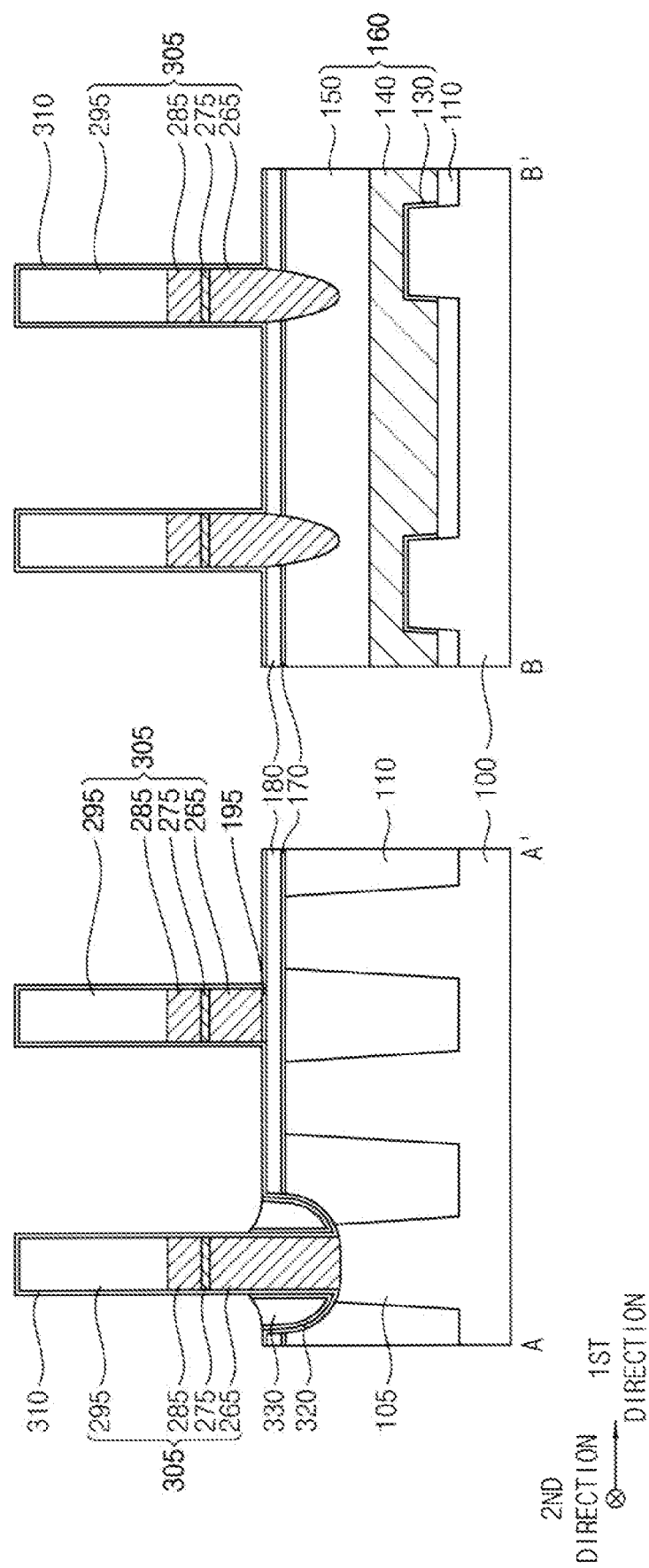

Referring to FIG. 20, a first spacer layer 310 may be formed on the upper surfaces of the active pattern 105, the isolation pattern 110, and the gate mask 150 exposed by the second opening 230, a sidewall of the second opening 230, and an upper surface of the second insulating layer 180 to cover the bit line structure 305, and fourth and fifth insulating layers may be sequentially formed on the first spacer layer 310.

The first spacer layer 310 may also cover a sidewall of the third insulating pattern 195 under a portion of the bit line structure 305 on the second insulating layer 180. The first spacer layer 310 may be formed to include, e.g., a nitride such as silicon nitride.

The fourth insulating layer may be formed to include, e.g., an oxide such as silicon oxide. The fifth insulating layer may be formed to include, e.g., a nitride such as silicon nitride. The fifth insulating layer may be formed to fill an entire portion of the second opening 230.

The fourth and fifth insulating layers may be etched by an etching process. In example embodiments, the etching process may be performed by a wet etching process, and all remaining portions of the fourth and fifth insulating layers except for a portion in the second opening 230 may be removed. Accordingly, almost an entire surface of the first spacer layer 310, that is, an entire portion of the first spacer layer 310 except for the portion in the second opening 230 may be exposed. Portions of the fourth and fifth insulating layers remaining in the second opening 230 may form fourth and fifth insulating patterns 320 and 330, respectively.

Figure 21:
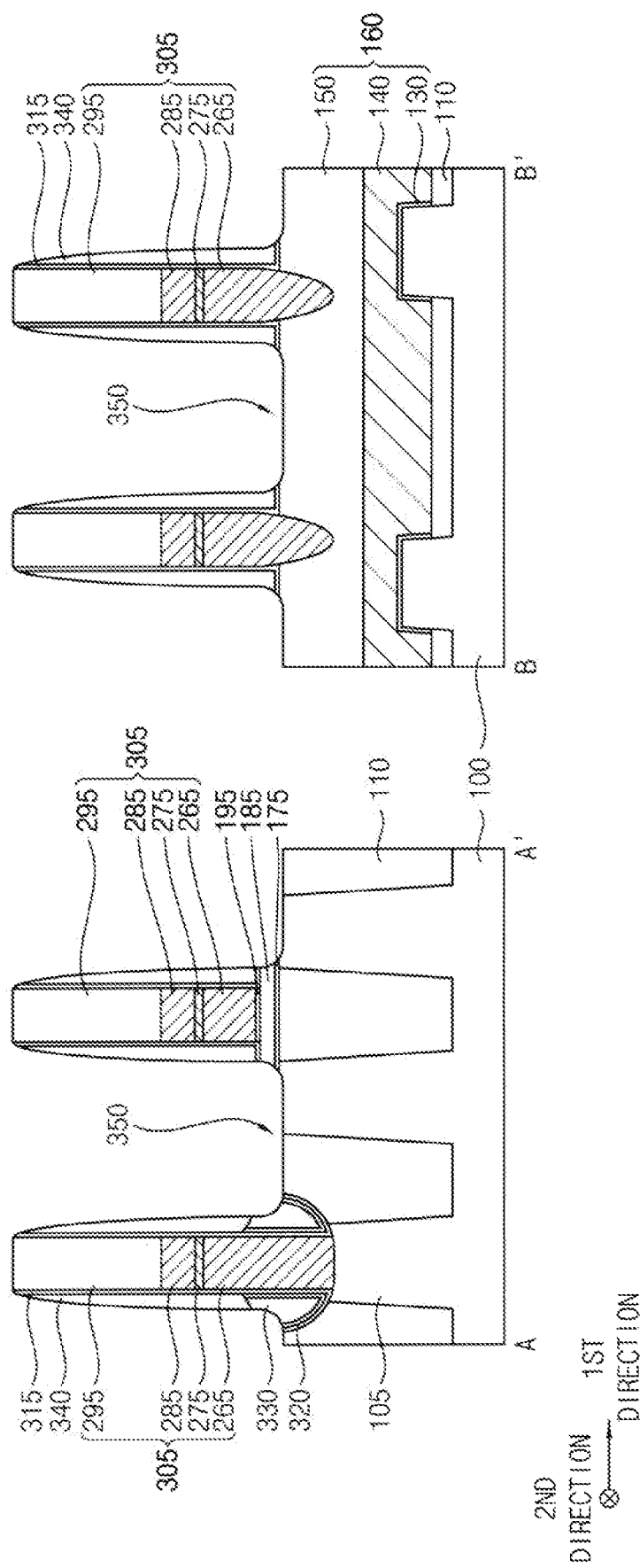

Referring to FIG. 21, a second spacer layer may be formed on the exposed surface of the first spacer layer 310 and the fourth and fifth insulating patterns 320 and 330 in the second opening 230, and may be anisotropically etched to form a second spacer 340 covering a sidewall of the bit line structure 305 on the surface of the first spacer layer 310 and the fourth and fifth insulating patterns 320 and 330.

The second spacer 340 may be formed to include, e.g., an oxide such as silicon oxide.

A third opening 350 may be formed by a dry etching process using the first capping pattern 295 and the second spacer 340 as an etching mask to expose the upper surface of the active pattern 105, and the upper surfaces of the isolation pattern 110 and the gate mask 150 may be also exposed by the third opening 350.

By the dry etching process, a portion of the first spacer layer 310 on upper surfaces of the first capping pattern 295 and the second insulating layer 180 may be removed to form a first spacer 315 covering a sidewall of the bit line structure 305. During the dry etching process, the first and second insulating layers 170 and 180 may be also be partially removed to remain as first and second insulating patterns 175 and 185, respectively. The first to third insulating patterns 175, 185, and 195 sequentially stacked under the bit line structure 305 may form an insulating pattern structure.

Figure 22:
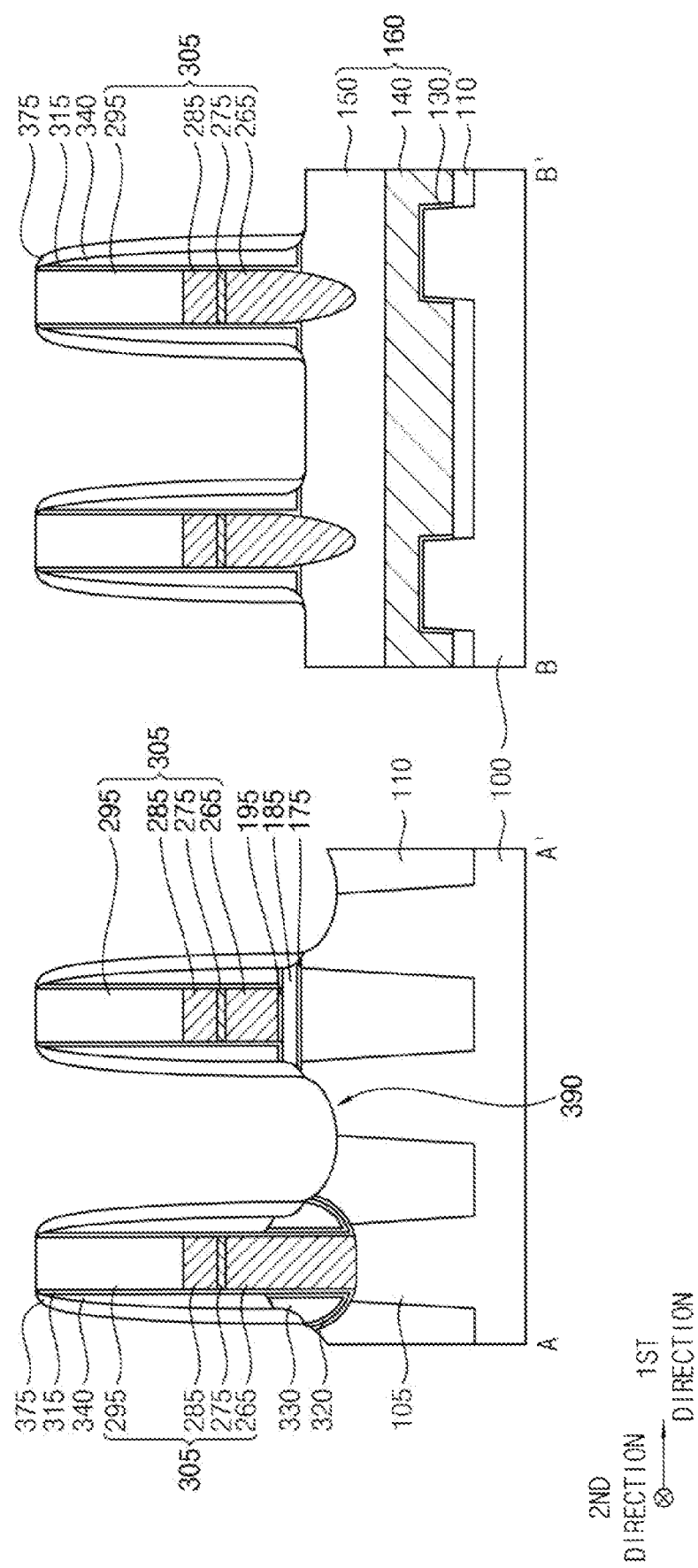

Referring to FIG. 22, a third spacer layer 370 may be formed on the upper surface of the first capping pattern 295, an upper surface of the first spacer 315, an outer sidewall of the second spacer 340, portions of upper surfaces of the fourth and fifth insulating patterns 320 and 330, and the upper surfaces of the active pattern 105, the isolation pattern 110, and the gate mask 150 exposed by the third opening 350, and may be anisotropically etched to form a third spacer 375 covering the sidewall of the bit line structure 305.

The first to third spacers 315, 340, and 375 sequentially stacked along a horizontal direction parallel to the upper surface of the substrate 100 on the sidewall of the bit line structure 305 may be referred to as a preliminary spacer structure.

An upper portion of the active pattern 105 may be etched by an additional etching process to form a fourth recess 390 connected with the third opening 350.

In example embodiments, the etching process may be performed by a wet etching process. In the wet etching process, an upper portion of the isolation pattern 110 adjacent to the upper portion of the active pattern 105 may be also etched, however, the third spacer 375, the first capping pattern 295 and the gate mask 150 including a material having an etching selectivity with respect to the active pattern 105 and the isolation pattern 110, e.g., a nitride may be hardly etched.

Figure 23:
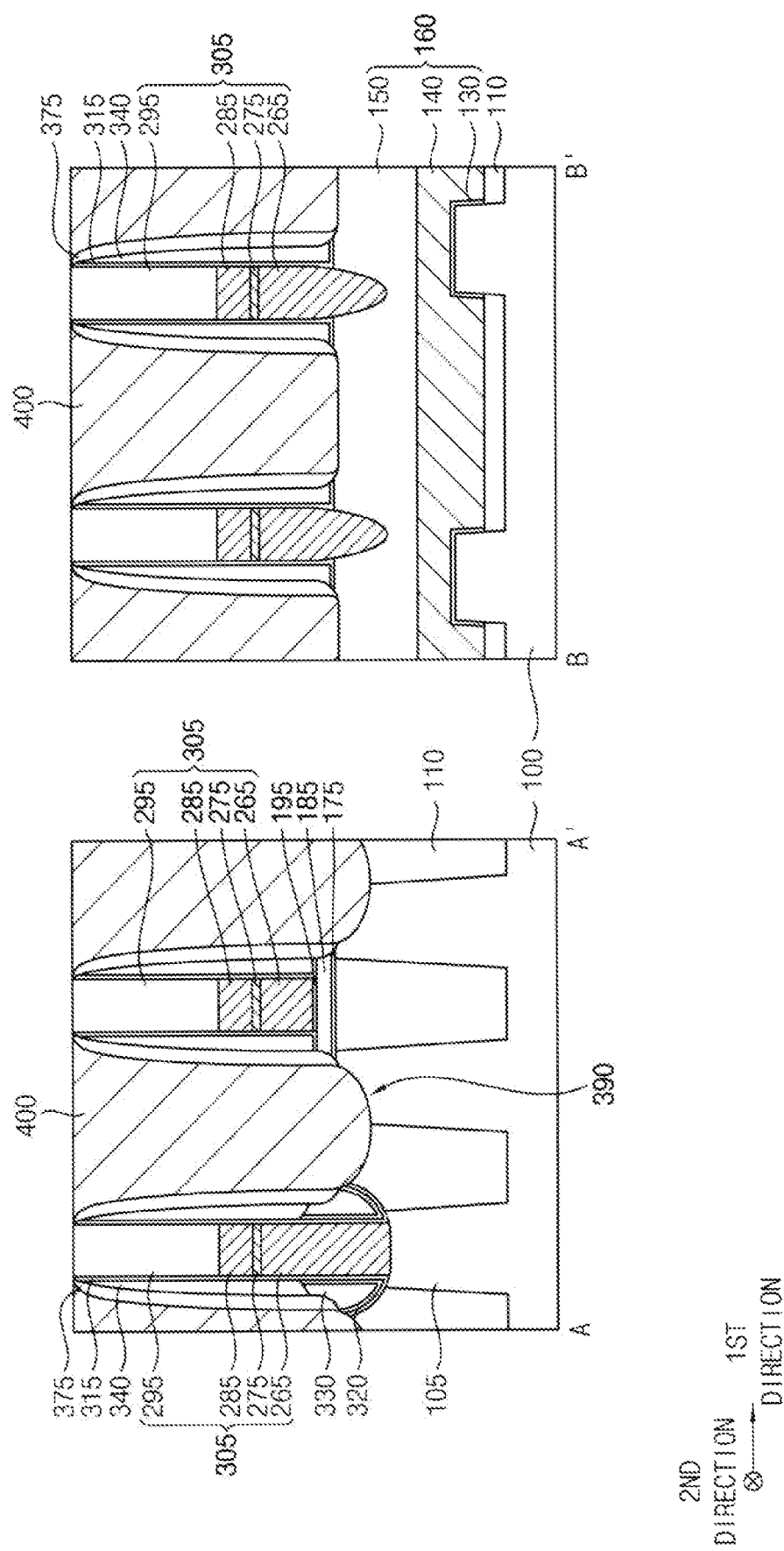

Referring to FIG. 23, a lower contact plug layer 400 may be formed to a sufficient height to fill the third opening 350 and the fourth recess 390, and may be planarized until the upper surface of the first capping pattern 295 is exposed.

In example embodiments, the lower contact plug layer 400 may extend in the second direction, and a plurality of lower contact plug layers 400 may be formed to be spaced apart from each other by the bit line structures 305 along the first direction.

Figure 24:
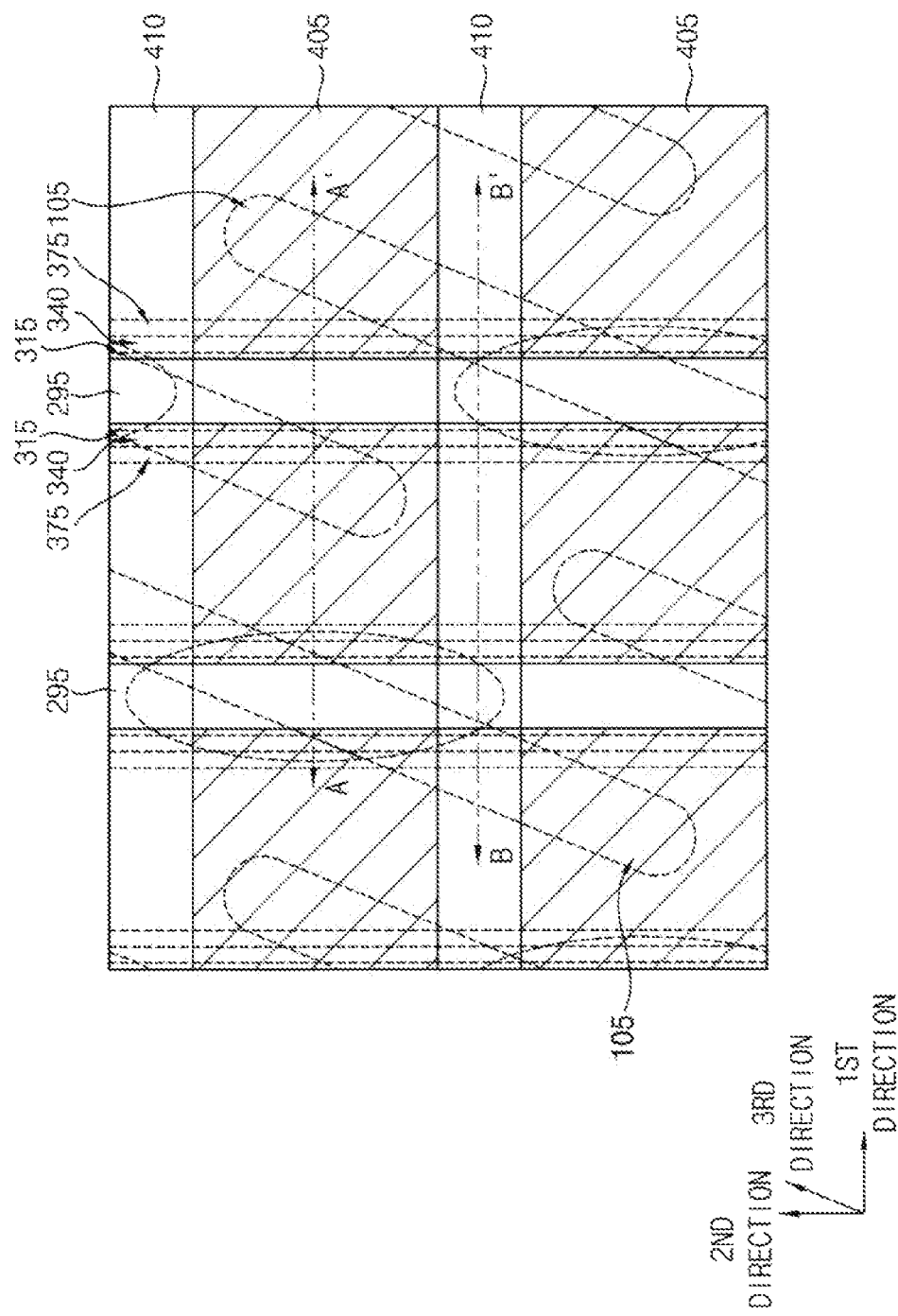
Figure 25:
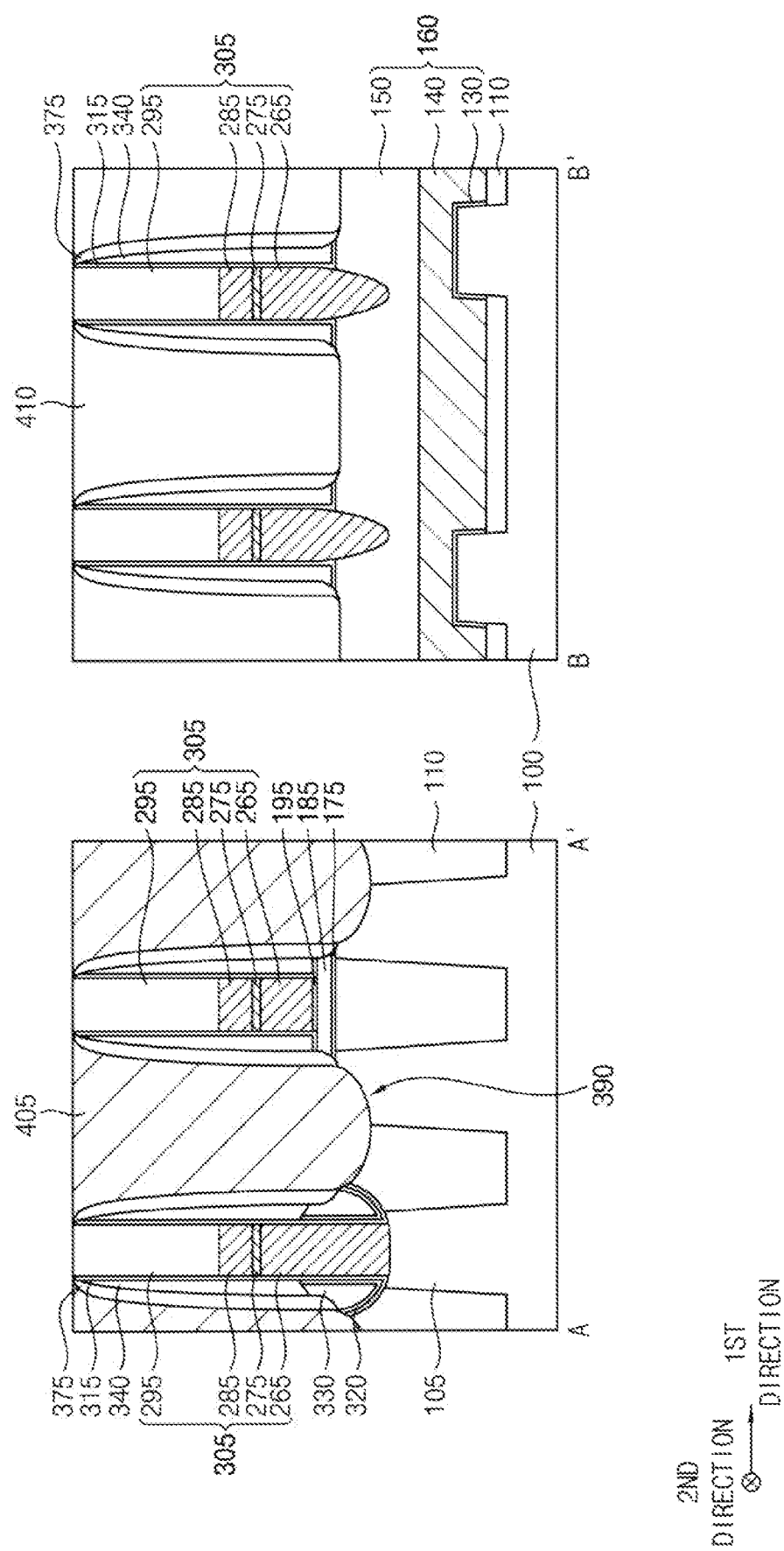

Referring to FIGS. 24 and 25, a fourth mask (not shown) including a plurality of fourth openings, each of which may extend in the first direction, spaced apart from each other in the second direction may be formed on the first capping pattern 295 and the lower contact plug layer 400, and the lower contact plug layer 400 may be etched by an etching process using the fourth mask as an etching mask.

In example embodiments, each of the fourth openings may overlap the gate structure 160 in a vertical direction perpendicular to the upper surface of the substrate 100. As the etching process is performed, a fifth opening exposing the upper surface of the gate mask 150 of the gate structure 160 may be formed between the bit line structures 305, and after removing the fourth mask, a second capping pattern 410 may be formed to fill the fourth opening. In example embodiments, the second capping pattern 410 may extend between the bit line structures 305 in the first direction, and a plurality of second capping patterns 410 may be formed along the second direction.

Accordingly, the lower contact plug layer 400 extending in the second direction between the bit line structures 305 may be transformed into a plurality of lower contact plugs 405 spaced apart from each other along the second direction by the second capping patterns 410.

Figure 26:
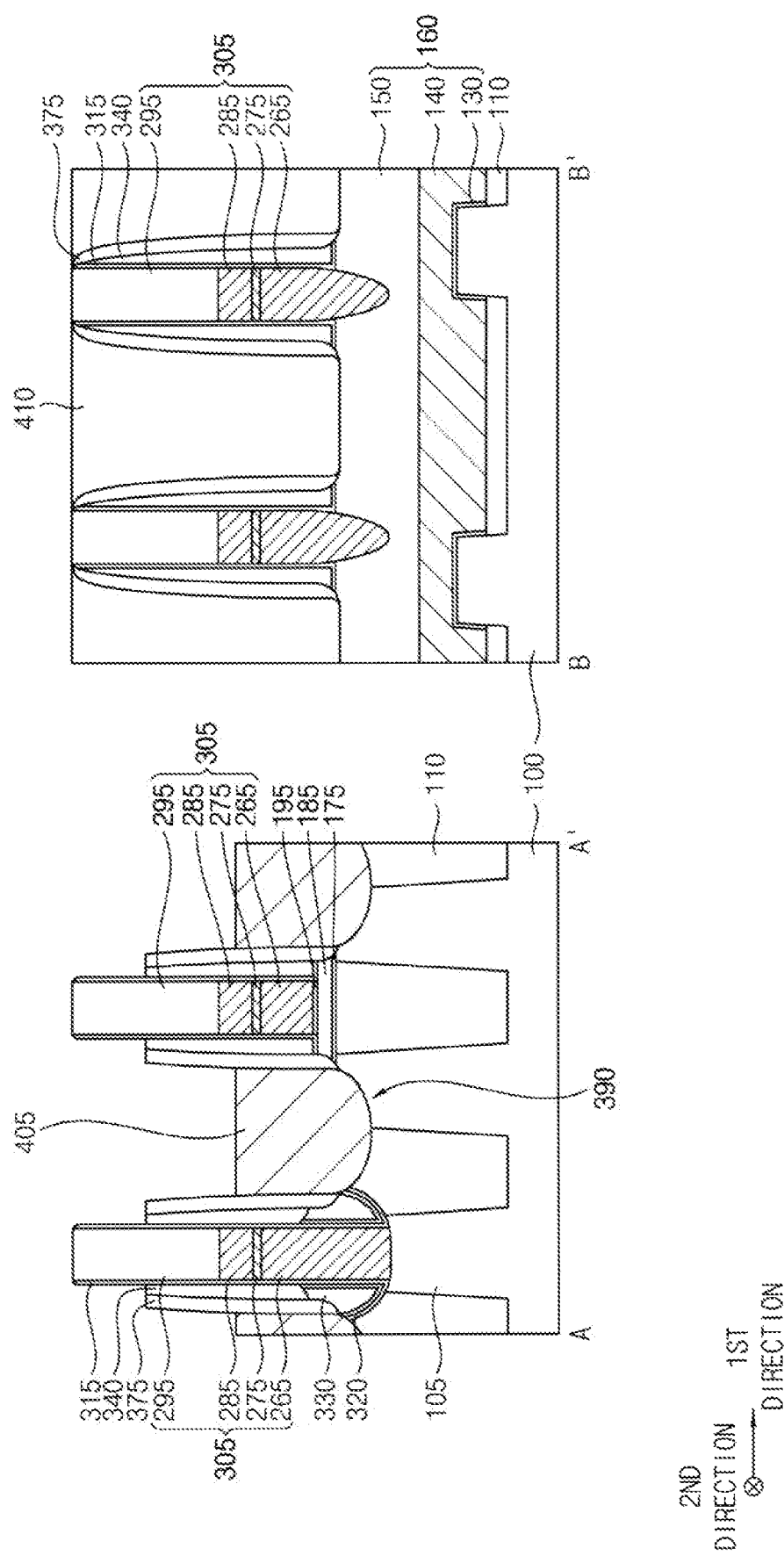

Referring to FIG. 26, an upper portion of the lower contact plug 405 may be removed to expose an upper portion of the preliminary spacer structure on the sidewall of the bit line structure 305, and upper portions of the second and third spacers 340 and 375 of the exposed preliminary spacer structure may be removed. An upper portion of the lower contact plug 405 may be further removed.

In example embodiments, an upper surface of the lower contact plug 405 may be lower than uppermost surfaces of the second and third spacers 340 and 375.

Figure 27:
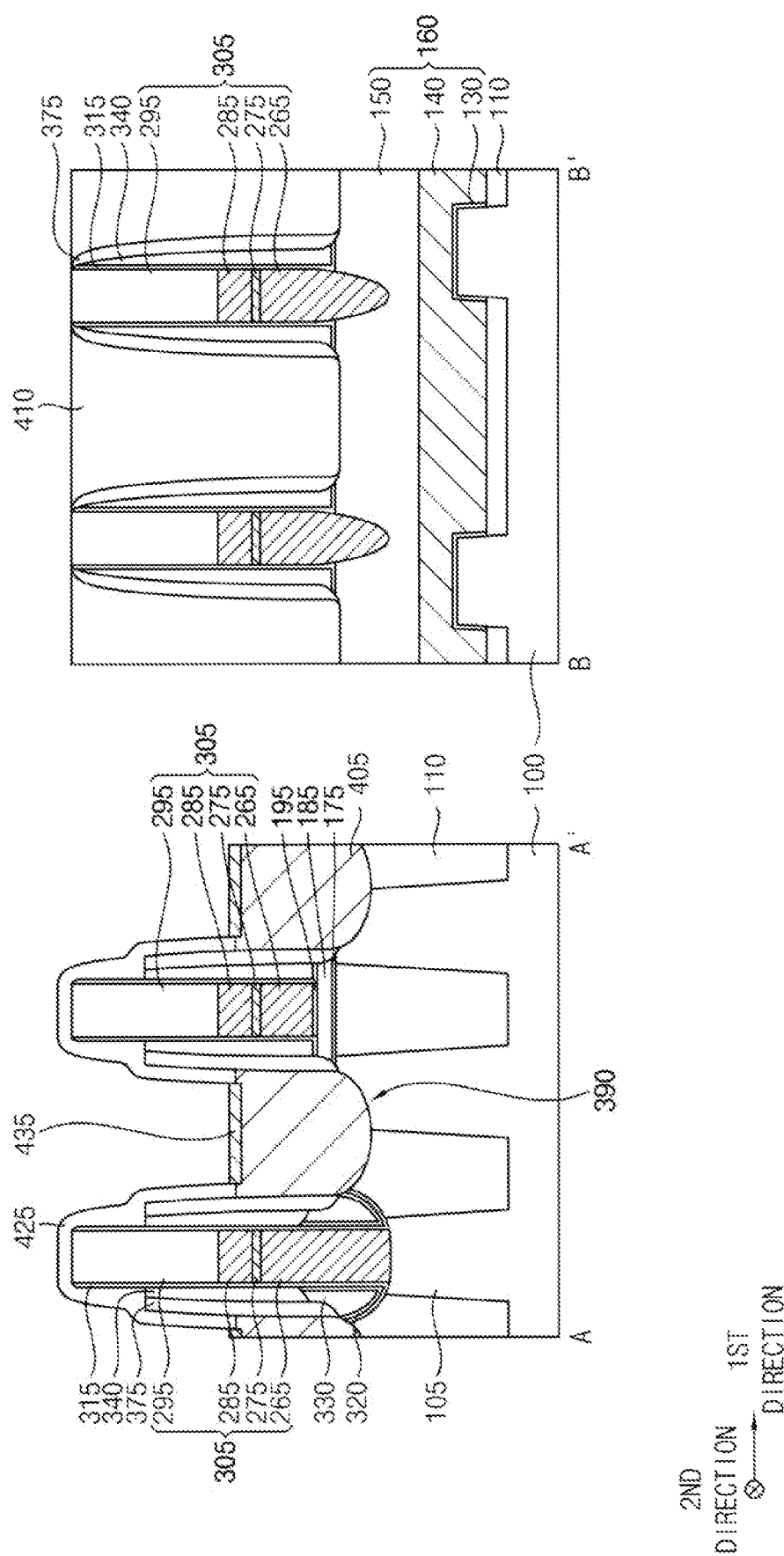

Referring to FIG. 27, a fourth spacer layer may be formed on the bit line structure 305, the preliminary spacer structure, the first and second capping patterns 295 and 410, and the lower contact plug 405, and may be anisotropically etched to form a fourth spacer 425 covering the first to third spacers 315, 340, and 375 on each of opposite sidewalls of the bit line structure 305 in the first direction, and thus the upper surface of the lower contact plug 405 may be exposed.

A metal silicide pattern 435 may be formed on the exposed upper surface of the lower contact plug 405. In example embodiments, the metal silicide pattern 435 may be formed by forming a second metal layer on the first and second capping patterns 295 and 410, the fourth spacer 425, and the lower contact plug 405, performing a heat treatment on the second metal layer, and removing an unreacted portion of the second metal layer.

Figure 28:
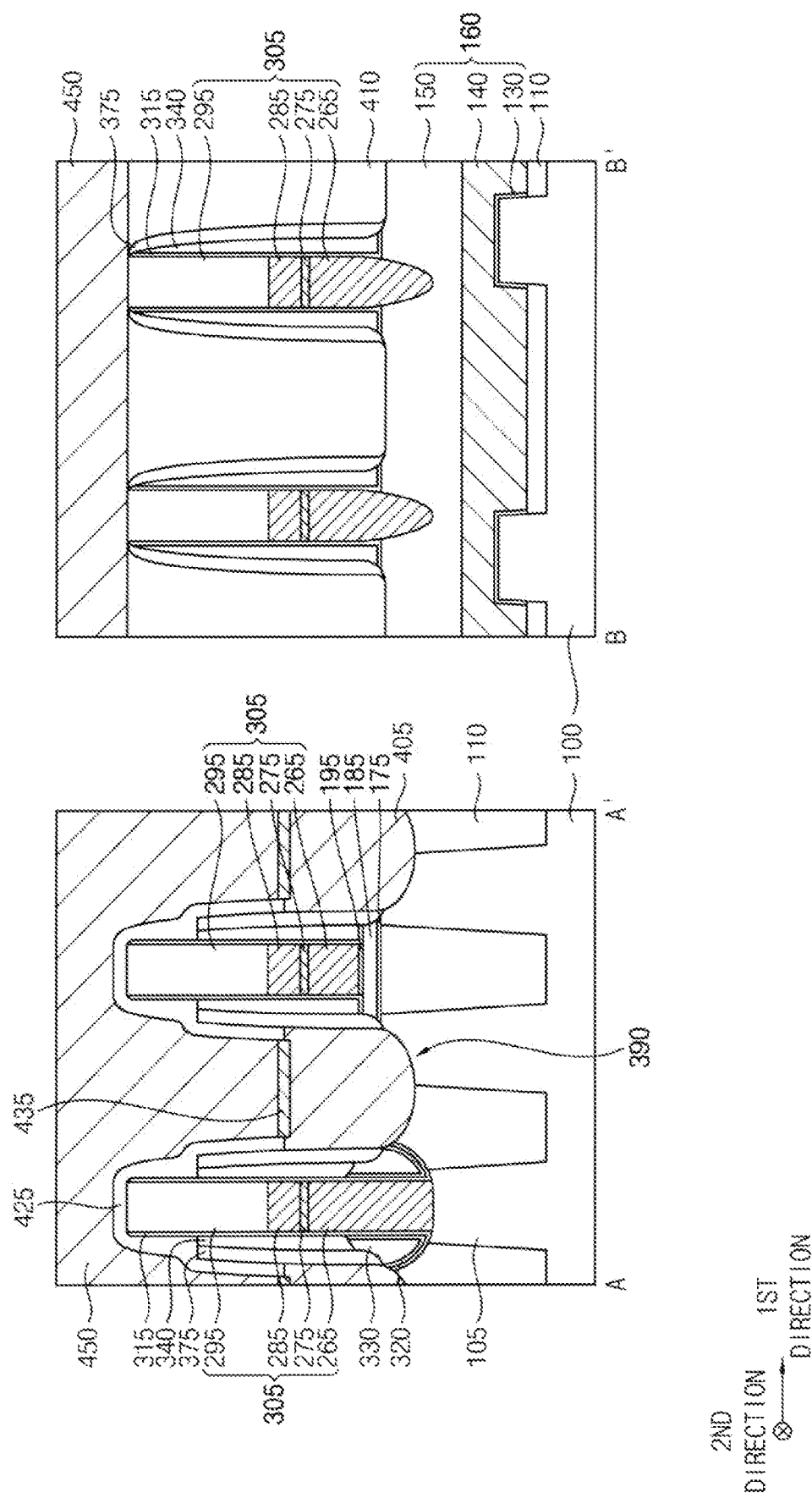

Referring to FIG. 28, an upper contact plug layer 450 may be formed on the first and second capping patterns 295 and 410, the first to fourth spacers 315, 340, 375, and 425, the metal silicide pattern 435, and the lower contact plug 405, and an upper portion of the upper contact plug layer 450 may be planarized.

In example embodiments, an upper surface of the upper contact plug layer 450 may be higher than upper surfaces of the first and second capping patterns 295 and 410.

Figure 29:
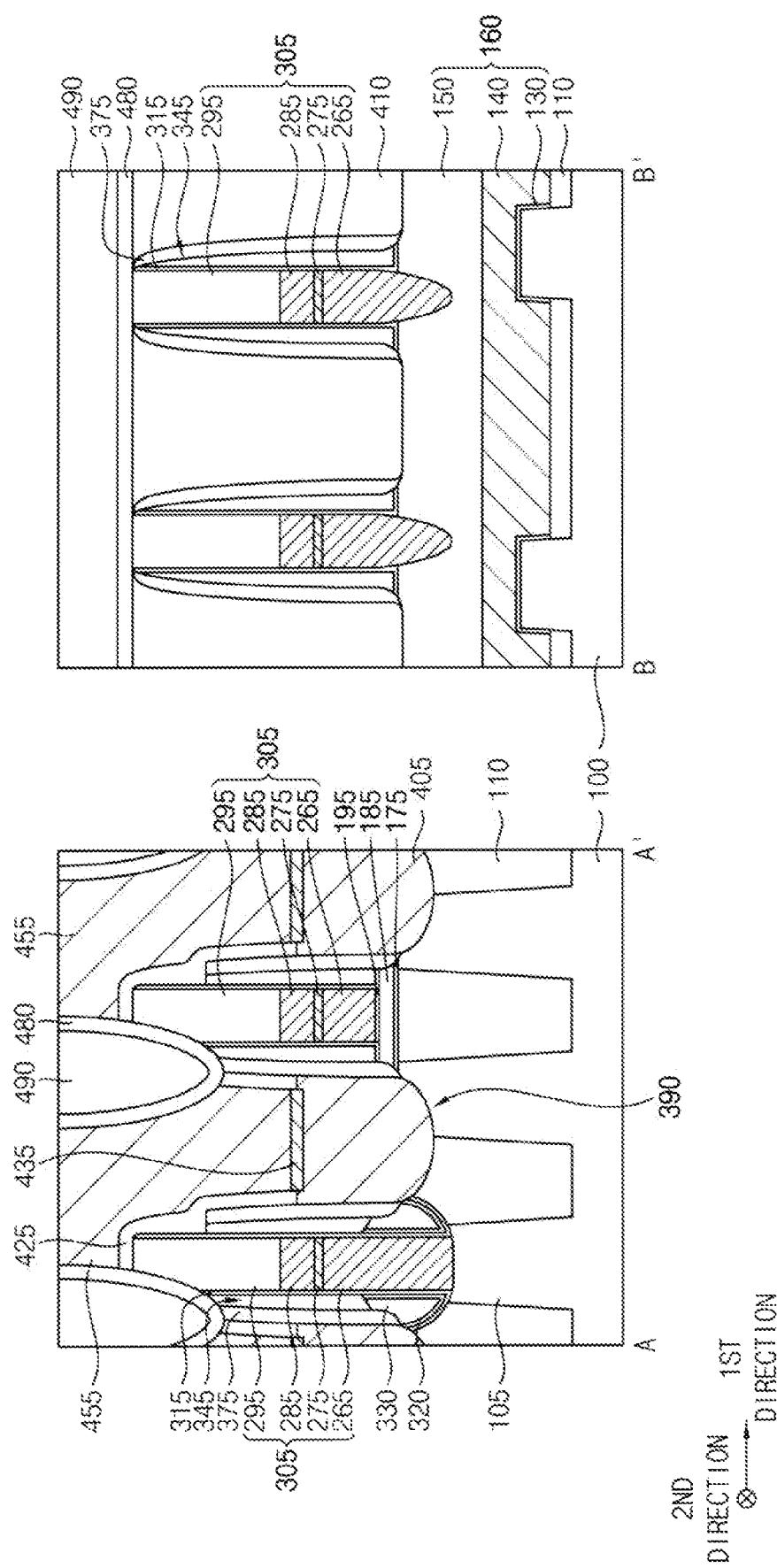

Referring to FIG. 29, the upper contact plug layer 450 may be patterned to form a fifth recess, and a first insulating interlayer structure including sixth and seventh insulating layers 480 and 490 sequentially stacked may be formed in the fifth recess. The first insulating interlayer structure may be also formed on the second capping pattern 410.

The fifth recess may be formed by removing an upper portion of the upper contact plug layer 450, an upper portion of the first capping pattern 295, and upper portions of the first, third, and fourth spacers 315, 375, and 425. Accordingly, an upper surface of the second spacer 340 may be exposed.

As the fifth recess is formed, the upper contact plug layer 450 may be transformed into a upper contact plug 455. In example embodiments, a plurality of upper contact plugs 455 may be formed to be spaced apart from each other in each of the first and second directions, and may be arranged in a honeycomb shape in a plan view. Each of the upper contact plugs 455 may have a circular, elliptical or polygonal shape in a plan view.

The lower contact plug 405, the metal silicide pattern 435, and the upper contact plug 455 sequentially stacked may form a contact plug structure.

The exposed second spacer 340 may be removed to form an air gap 345 connected with the fifth recess. The second spacer 340 may be removed, e.g., by a wet etching process.

A second insulating interlayer 480 may be formed using a material having a low gap-filling property, so that the air gap 345 under the fifth recess may not be filled, but remain. The air gap 345 may be also referred to as an air spacer 345, and may form a spacer structure together with the first, third, and fourth spacers 315, 375, and 425. That is, the air gap 345 may be a spacer including air.

Figure 30:
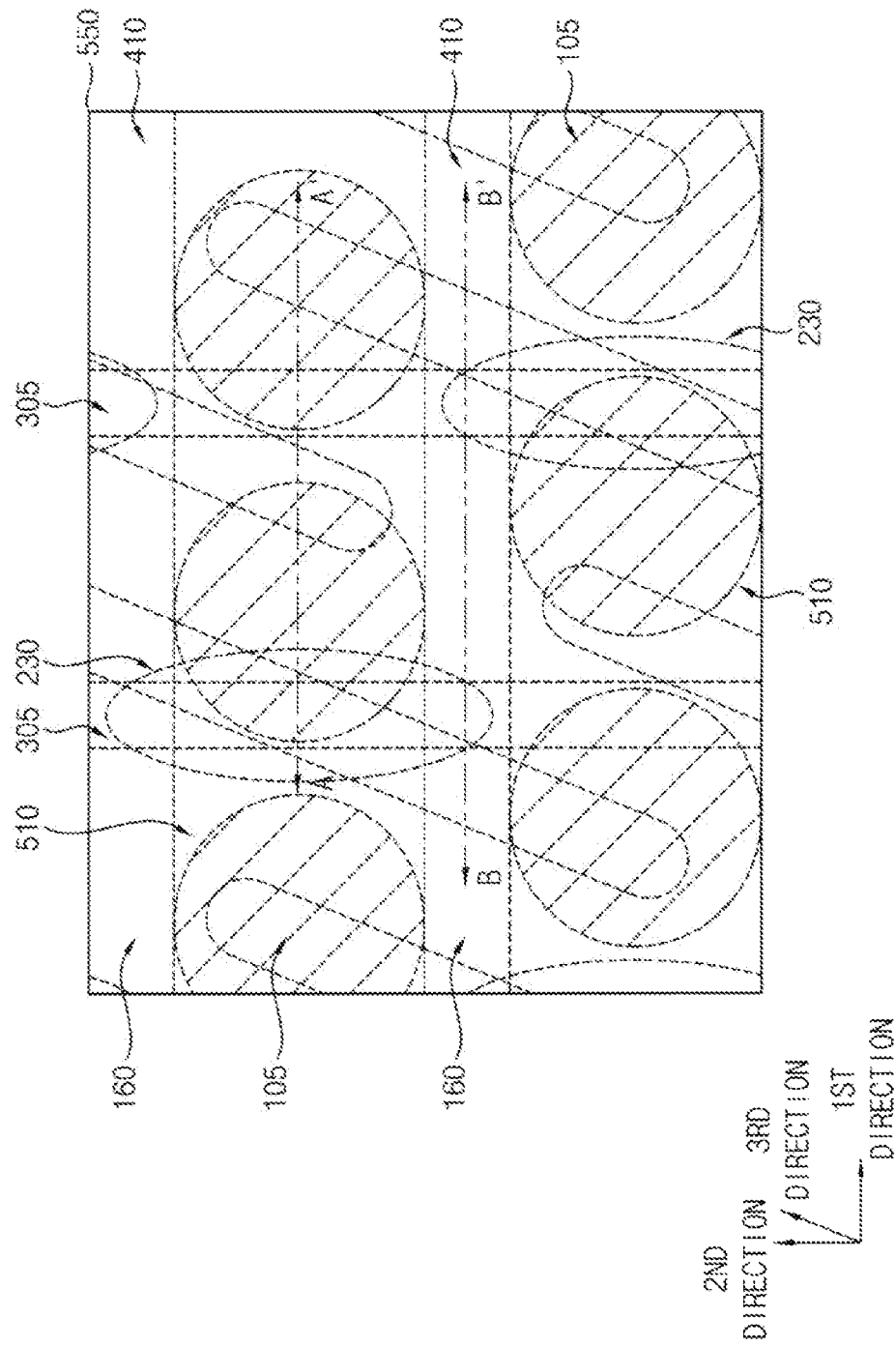
Figure 31:
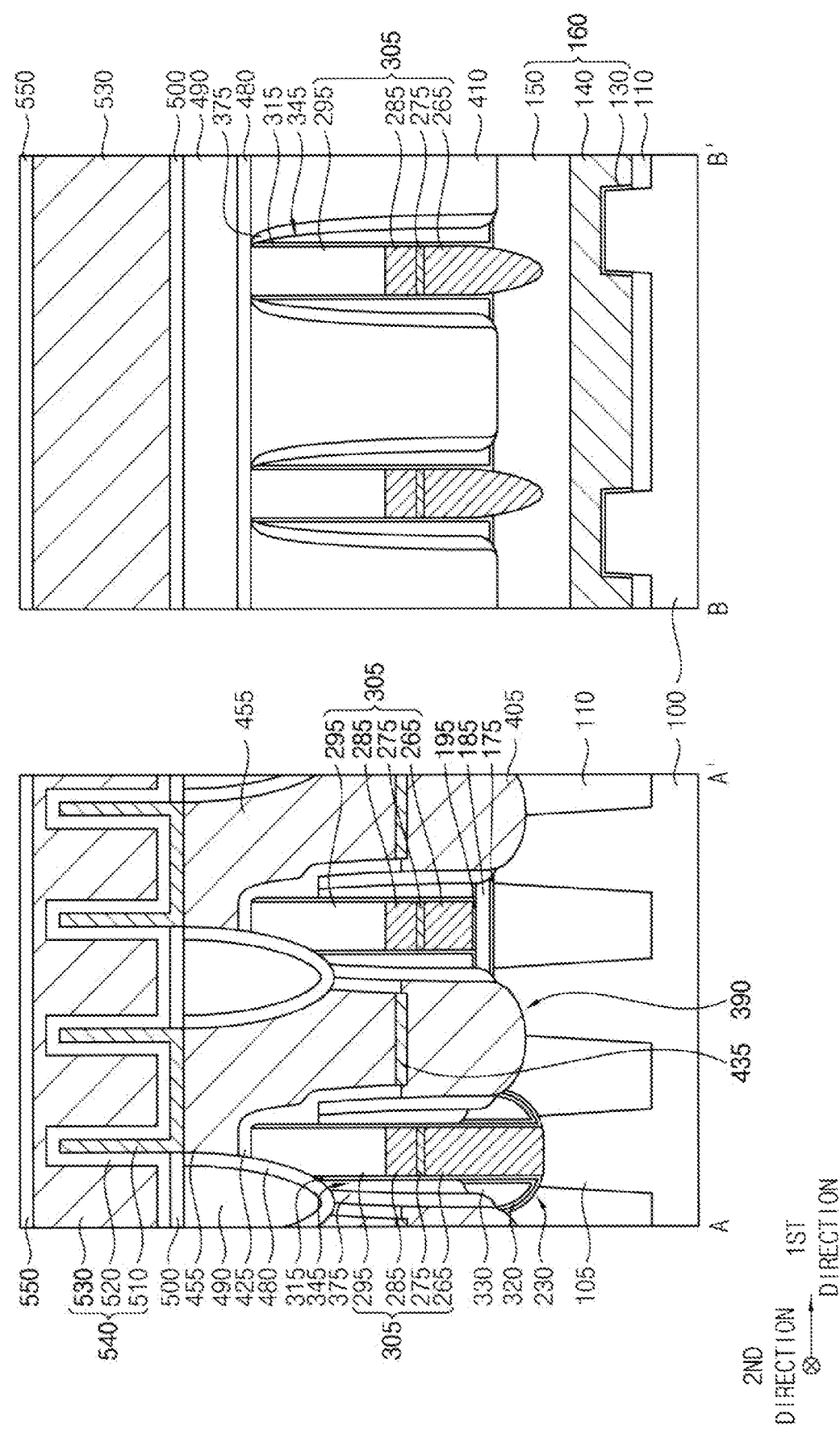

FIGS. 30 and 31, processes substantially the same as or similar to those illustrated with reference to FIGS. 1 to 12 may be performed to complete the fabrication of a capacitor structure 540.

Specifically, after forming an etch stop layer 500 and a lower electrode 510 on the first insulating interlayer structure and the upper contact plug 455, respectively, a dielectric layer 520 may be formed on the etch stop layer 500 and the lower electrode 510, and an upper electrode 530 may be formed on the dielectric layer 520 to form the capacitor structure 540.

A first seed layer including a first metal precursor may be formed, a second seed layer including a second metal precursor may be formed by substituting a ligand including an amino group among ligands bound to the central metal of the first metal precursor with a ligand including an amino group having a smaller size than the amino group being replaced, where a third seed layer may be formed on the second seed layer by further providing the first metal precursor, an oxidation process may be performed on the third seed layer to form the dielectric layer 520.

A second insulating interlayer 550 may be further formed to cover the capacitor structure 540.

Figure 32:
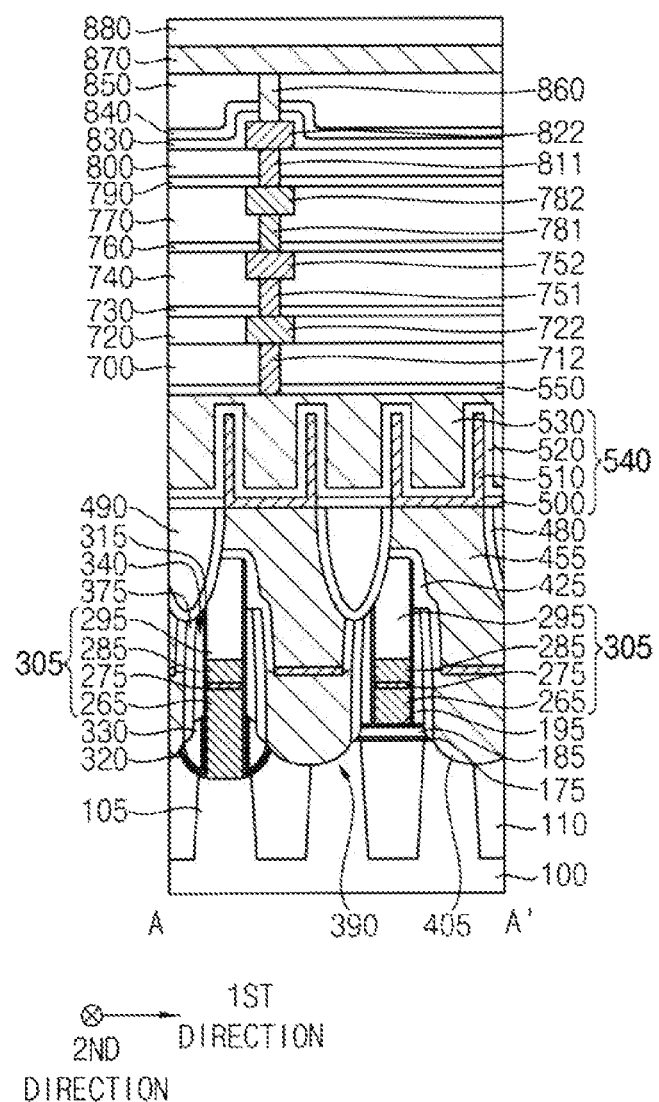

Referring to FIG. 32, after forming a third insulating interlayer 700 on the second insulating interlayer 550, a first contact plug 712 may be formed through the second and third interlayer insulating layers 550 and 700 to contact the capacitor structure 540. The third insulating interlayer 700 may include, for example, silicon oxide such as tetraethyl orthosilicate (TEOS).

A fourth insulating interlayer 720 may be formed on the third insulating interlayer 700 and the first contact plug 712, and a first wiring 722 may be formed through the fourth insulating interlayer 720 to contact the first contact plug 712.

A first etch stop layer 730 and a fifth insulating interlayer 740 may be sequentially stacked on the fourth insulating interlayer 720 and the first wiring 722. A first via 751 may be formed through the first etch stop layer 730 and a lower portion of the fifth insulating interlayer 740 to contact the first wiring 722. A second wiring 752 may be formed through an upper portion of the fifth insulating interlayer 740 to contact the first via 751. In example embodiments, the first via 751 and the second wiring 752 may be simultaneously formed by a dual damascene process, however, the inventive concept may not be limited thereto, and the first via 751 and the second wiring 752 may be formed independently by a single damascene process.

A second etch stop layer 760 and a sixth insulating interlayer 770 may be sequentially stacked on the fifth insulating interlayer 740 and the second wiring 752. A second via 781 may be formed through the second etch stop layer 760 and a lower portion of the sixth insulating interlayer 770 to contact the second wiring 752. A third wiring 782 may be formed through an upper portion of the sixth insulating interlayer 770 to contact the second via 781.

A third etch stop layer 790 and a seventh insulating interlayer 800 may be sequentially stacked on the sixth insulating interlayer 770 and the third wiring 782. A third via 811 may be formed through the third etch stop layer 790 and the seventh insulating interlayer 800 to contact the third wiring 782. A fourth wiring 822 may be formed on the seventh insulating interlayer 800 to contact the third via 811.

In example embodiments, each of the fourth to sixth insulating interlayers 720, 740, and 770 may include, for example, a low dielectric material such as fluorine or carbon doped silicon oxide, porous silicon oxide (SiOCH), spin-on organic polymer, inorganic polymers such as HSSQ and MSSQ, etc. Each of the first to third etch stop layers 730, 760, and 790 may include, for example, silicon carbonitride (SiCN). The seventh insulating interlayer 800 may include, for example, silicon oxide such as TEOS.

A first passivation layer structure may be formed on the fourth wiring 822 and the seventh insulating interlayer 800. A fourth via 860 may be formed through the first passivation layer structure to contact the fourth wiring 822. A redistribution layer 870 may be formed to contact an upper surface of the fourth via 860.

In example embodiments, the first passivation layer structure may include a first oxide layer 830, a nitride layer 840, and a second oxide layer 850 sequentially stacked.

A semiconductor device may be completed by forming a second passivation layer 880 on the redistribution layer 870 and the second oxide layer 850.

As described above, since the dielectric layer 520 may be formed to have an increased density, a permittivity thereof may be improved, and accordingly, electrical characteristics of the capacitor structure 540 including the same may be improved. In addition, since a thickness of the dielectric layer 520 may not increase even though the density of the dielectric layer 520 increases and the permittivity thereof is improved, the integration degree of the semiconductor device including the same may not be deteriorated.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A method of forming a capacitor structure, the method comprising:
    forming a lower electrode on a substrate;
    providing a first metal precursor onto the lower electrode to form a first seed layer, the first metal precursor including a first metal and first and second ligands bound to the first metal, the first and second ligands being organic groups;
    substituting the second ligand with a third ligand that has an amino group —$NH_2$ to form a second seed layer including a second metal precursor, and wherein the amino group —$NH_2$ of the third ligand has a size smaller than that of the amino group (—$NR^1R^2$) of the second ligand;
    providing a third metal precursor onto the second seed layer to form a third seed layer, the third metal precursor including fourth and fifth ligands, and the third seed layer including the second and third metal precursors;
    performing an oxidation process on the third seed layer to form a dielectric layer; and
    forming an upper electrode on the dielectric layer,
    wherein the dielectric layer includes a first portion and a second portion on the first portion, and wherein a detection amount of nitrogen in the dielectric layer has a maximum value at a boundary between the first portion and the second portion.

2. The method as claimed in claim 1, wherein first metal includes at least one selected from a group consisting of Li, Be, B, Na, Mg, Al, K, Ca, Sc, Ti, V, Cr, Mn, Fe, Co, Ni, Cu, Zn, Ga, Ge, Rb, Sr, Y, Zr, Vb, Mo, Tc, Ru Rh, Pd, Ag, Cd, In, Sn, Sb, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Pb, Bi, Po, Fr, Ra and Ac.

3. The method as claimed in claim 1, wherein the lower electrode includes a metal nitride, and a maximum value of a detection amount of nitrogen (N) in the dielectric layer is greater than a maximum value of a detection amount of nitrogen (N) in the lower electrode.

4. The method as claimed in claim 1, wherein the boundary between the first portion and the second portion is between a bottom surface and a central portion of the dielectric layer.

5. The method as claimed in claim 1, wherein the detection amount of nitrogen in the dielectric layer has a value greater at a bottom surface than at an upper surface thereof.

6. The method as claimed in claim 1, wherein the detection amount of nitrogen in the dielectric layer has a minimum value at an upper surface thereof.

7. The method as claimed in claim 1, wherein the second portion of the dielectric layer has a thickness greater than a thickness of the first portion thereof.

8. The method as claimed in claim 1, wherein the dielectric layer and the lower electrode include different metals from each other.

9. The method as claimed in claim 1, wherein the lower electrode includes TiN.

10. A method of forming a capacitor structure, the method comprising:
    forming a lower electrode on a substrate;
    providing a first metal precursor onto the lower electrode to form a first seed layer, the first metal precursor including a first metal and first and second ligands bound to the first metal, the first and second ligands being organic groups;
    substituting the second ligand with a third ligand that has an amino group —$NH_2$ to form a second seed layer including a second metal precursor, and wherein the amino group —$NH_2$ of the third ligand has a size smaller than that of the amino group (—$NR^1R^2$) of the second ligand;
    providing a third metal precursor onto the second seed layer to form a third seed layer, the third metal precursor including fourth and fifth ligands, and the third seed layer including the second and third metal precursors;
    performing an oxidation process on the third seed layer to form a dielectric layer; and
    forming an upper electrode on the dielectric layer,
    wherein the dielectric layer includes a first portion and a second portion on the first portion, and
    wherein a detection amount of nitrogen in the dielectric layer has a maximum value at a boundary between the first portion and the second portion.

11. The method as claimed in claim 10, wherein the first ligand is an alkyl group having 1 to 5 carbon atoms, or an aromatic cyclic group or a heterocyclic group having 4 or more carbon atoms.

12. The method as claimed in claim 10, wherein substituting the second ligand with the third ligand is performed by providing ammonia ($NH_3$) gas onto the first seed layer.

13. The method as claimed in claim 10, wherein the first ligand is cyclopentane, and the second ligand is dimethylamine.

14. The method as claimed in claim 10, wherein the oxidation process uses ozone ($O_3$) gas or ozone ($O_3$) plasma.

15. The method as claimed in claim 10, wherein the third metal precursor includes a central metal and two ligands bound to the central metal, the central metal being different from the first metal.

16. The method as claimed in claim 15, wherein the first metal of the first metal precursor is aluminum (Al) or zirconium (Zr), and the central metal of the third metal precursor is zirconium (Zr) or aluminum (Al).

17. The method as claimed in claim 10, wherein the second ligand is an amino group or a nitrogen group including the amino group.

18. The method as claimed in claim 17, wherein the second ligand is represented by —$NR^1R^2$, wherein $R^1$ and $R^2$ are independently alkyl groups having 1 to 5 carbon atoms, an alkyl group having greater than 6 carbon atoms, an aryl group, or a heterocyclic group having 4 or more carbon atoms.

19. A method of manufacturing a semiconductor device, the method comprising:
    forming gate structures each extending at an upper portion of a substrate in a first direction parallel to an upper surface of the substrate, the gate structures being spaced apart from each other in a second direction parallel to the upper surface of the substrate and intersecting the first direction;
    forming bit line structures spaced apart from each other in the first direction on the gate structures, each of the bit line structures extending in the second direction;
    forming at least one contact plug structure to be adjacent to at least one of the bit line structures; and
    forming a capacitor structure to contact an upper surface of the at least one contact plug structure, the capacitor structure including a lower electrode, a dielectric layer, and an upper electrode sequentially stacked,
    wherein forming the capacitor structure includes:
    providing a first metal precursor onto the lower electrode to form a first seed layer, the first metal precursor including a central metal and first and second ligands bound to the first central metal;
    substituting the second ligand with a third ligand including an amino group (—$NH_2$) to form a second seed layer including a second metal precursor, the second ligand including an amino group (—$NR^1R^2$, where $R^1$ and $R^2$ are alkyl groups having 1 to 5 carbon atoms that are equal to or different from each other), and the amino group (—$NH_2$) having a size smaller than that of the amino group (—$NR^1R^2$);
    providing a third metal precursor onto the second seed layer to form a third seed layer, the third metal precursor including fourth and fifth ligands, and the third seed layer including the second and third metal precursors; and
    performing an oxidation process on the third seed layer to form the dielectric layer.

20. The method as claimed in claim 19, wherein the first ligand is an alkyl group having 1 to 5 carbon atoms, or an aromatic cyclic group or a heterocyclic group having 4 or more carbon atoms, and wherein the second ligand is represented by —$NR^1R^2$, wherein $R^1$ and $R^2$ are independently alkyl groups having 1 to 5 carbon atoms, an alkyl group having greater than 6 carbon atoms, an aryl group, or a heterocyclic group having 4 or more carbon atoms.

* * * * *